(12) United States Patent
Fujii

(10) Patent No.: US 12,046,514 B2
(45) Date of Patent: *Jul. 23, 2024

(54) SEMICONDUCTOR WAFER AND SEMICONDUCTOR CHIP

(71) Applicant: KIOXIA CORPORATION, Tokyo (JP)

(72) Inventor: Mika Fujii, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,557

(22) Filed: May 18, 2023

(65) Prior Publication Data

US 2023/0290685 A1    Sep. 14, 2023

Related U.S. Application Data

(63) Continuation of application No. 17/014,842, filed on Sep. 8, 2020, now Pat. No. 11,694,928.

(30) Foreign Application Priority Data

Mar. 9, 2020    (JP) ................................ 2020-039826

(51) Int. Cl.
| | |
|---|---|
| *H01L 21/78* | (2006.01) |
| *H01L 21/02* | (2006.01) |
| *H01L 23/00* | (2006.01) |
| *H01L 23/532* | (2006.01) |
| *H01L 23/544* | (2006.01) |

(52) U.S. Cl.
CPC ........ *H01L 21/78* (2013.01); *H01L 21/02021* (2013.01); *H01L 23/532* (2013.01); *H01L 23/544* (2013.01); *H01L 23/562* (2013.01); *H01L 2223/5446* (2013.01)

(58) Field of Classification Search
None
See application file for complete search history.

(56) References Cited

U.S. PATENT DOCUMENTS

| | | | |
|---|---|---|---|
| 6,211,070 B1 | 4/2001 | Iwasaki | |
| 2006/0099775 A1* | 5/2006 | Daubenspeck | ... H01L 21/76838 257/E21.309 |
| 2007/0102791 A1* | 5/2007 | Wu | ....... H01L 23/585 257/618 |
| 2009/0039470 A1 | 2/2009 | Vo | |

(Continued)

FOREIGN PATENT DOCUMENTS

| | | |
|---|---|---|
| CN | 109427804 A | 3/2019 |
| JP | 2005-260059 | 9/2005 |

(Continued)

*Primary Examiner* — Khaja Ahmad
(74) *Attorney, Agent, or Firm* — Oblon, McClelland, Maier & Neustadt, L.L.P.

(57) ABSTRACT

According to one embodiment, a semiconductor wafer is formed with a plurality of first regions each provided with a circuit element and a second region between the first regions. The semiconductor wafer includes a first structure in which a first embedding material is embedded in a first recess extending in a first direction perpendicular to a surface of a substrate. The first structure is between edges of the first regions and a third region that is cut in the second region when the first regions are separated.

11 Claims, 23 Drawing Sheets

(56) References Cited

U.S. PATENT DOCUMENTS

| | | |
|---|---|---|
| 2009/0294912 A1 | 12/2009 | Chibahara et al. |
| 2010/0261334 A1 | 10/2010 | Chibahara et al. |
| 2011/0140245 A1 | 6/2011 | Lane |
| 2011/0266657 A1 | 11/2011 | Chibahara et al. |
| 2012/0267793 A1 | 10/2012 | Chibahara et al. |
| 2014/0027928 A1 | 1/2014 | Watanabe et al. |
| 2014/0287568 A1 | 9/2014 | Nishimura |
| 2016/0204074 A1* | 7/2016 | Lin ................. H01L 21/784 257/76 |
| 2018/0269162 A1* | 9/2018 | Takahashi ......... H01L 29/0619 |
| 2019/0043757 A1 | 2/2019 | Zechmann et al. |
| 2019/0057898 A1* | 2/2019 | Shim ................. H10B 43/35 |
| 2019/0164910 A1* | 5/2019 | Roh .................. H10B 12/50 |
| 2019/0198453 A1* | 6/2019 | Sekikawa ........... H01L 23/562 |
| 2019/0371742 A1 | 12/2019 | Utsunomiya |
| 2022/0028731 A1 | 1/2022 | Shim et al. |

FOREIGN PATENT DOCUMENTS

| | | |
|---|---|---|
| JP | 2006-093407 | 4/2006 |
| JP | 2009-21474 A | 1/2009 |
| JP | 2009-290090 A | 12/2009 |
| JP | 2010-536174 A | 11/2010 |
| JP | 2011-192954 | 9/2011 |
| JP | 2014-003114 | 1/2014 |
| JP | 2014-22611 A | 2/2014 |
| JP | 2014-27057 A | 2/2014 |
| JP | 2019-114673 | 7/2019 |
| JP | 2019-212703 A | 12/2019 |

\* cited by examiner

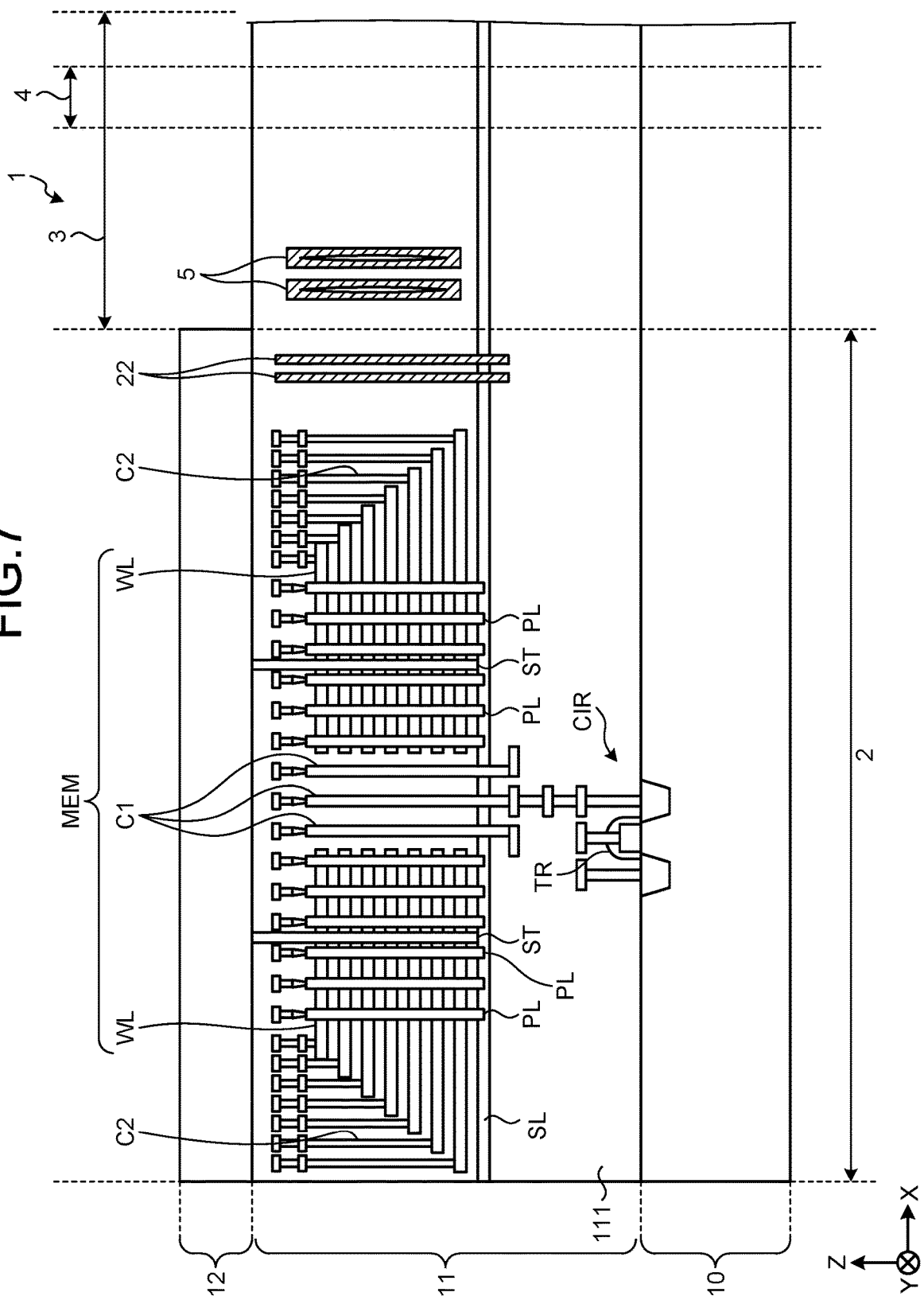

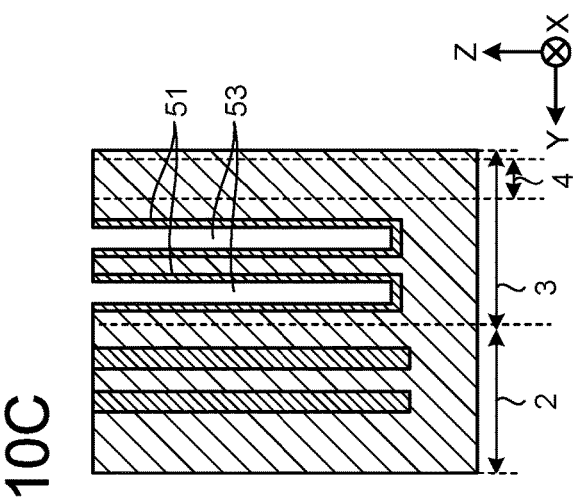
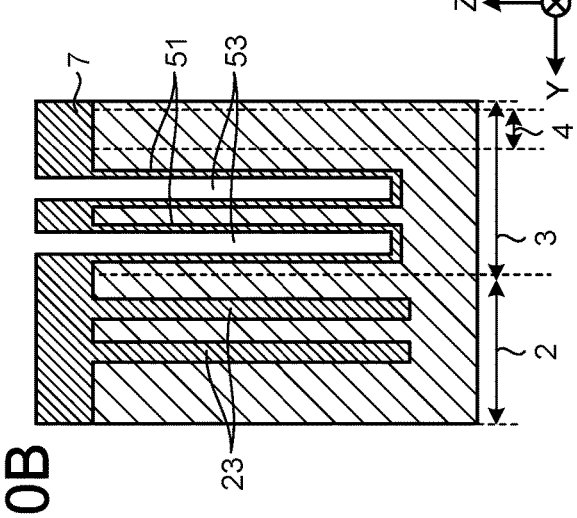
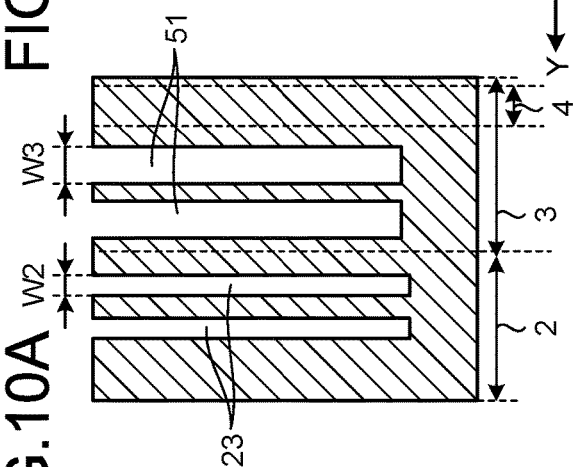
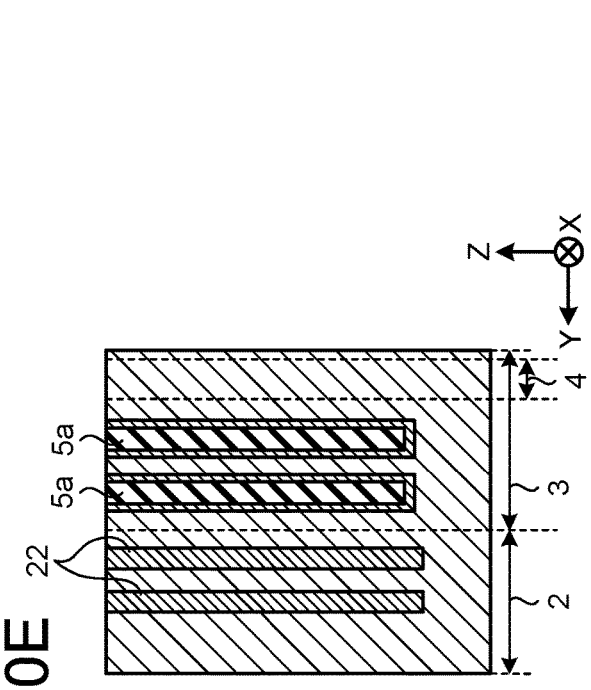
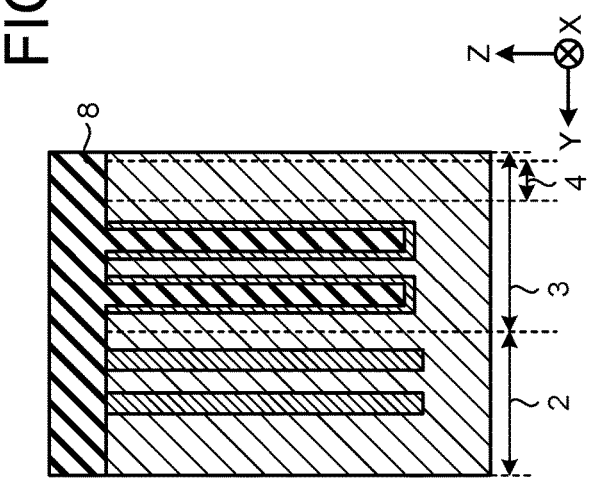

FIG.12
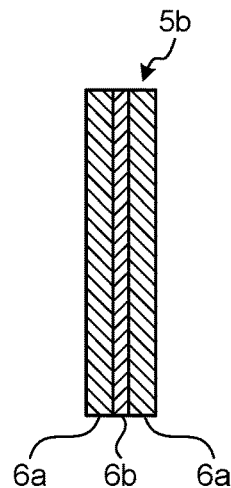
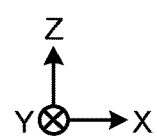
FIG.13
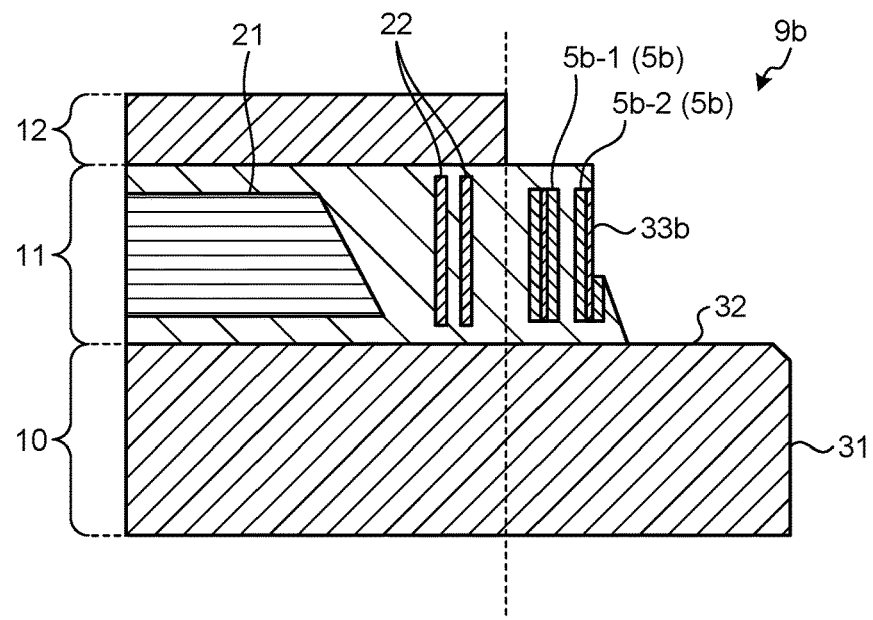
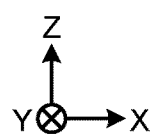

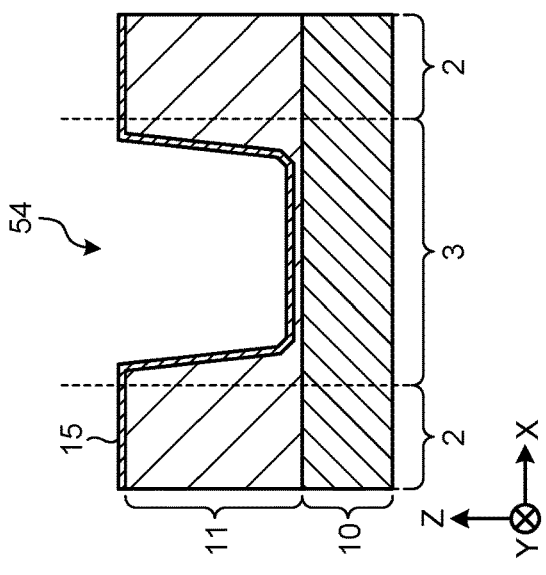
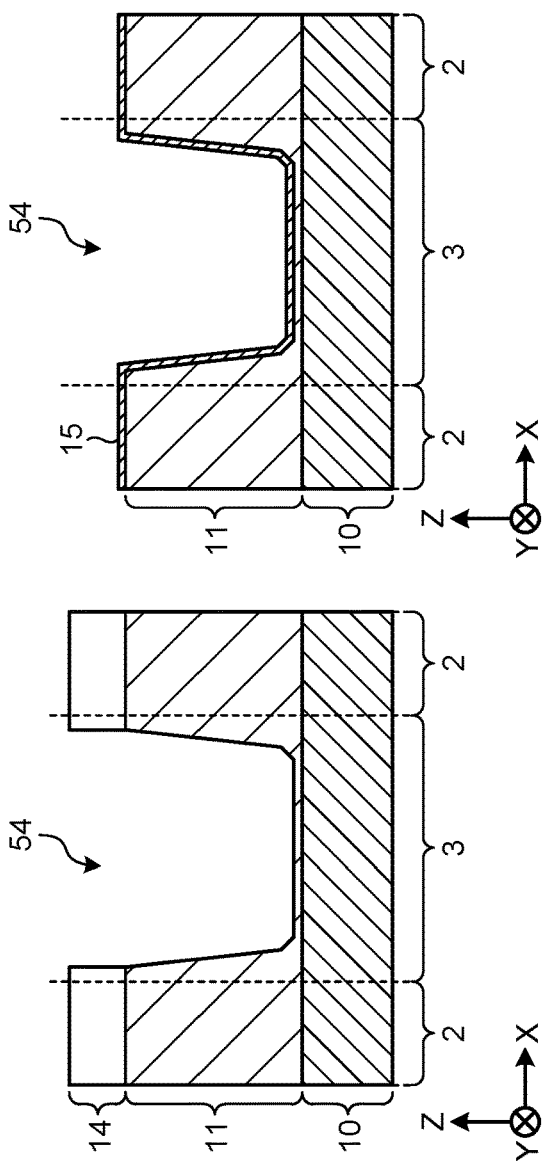
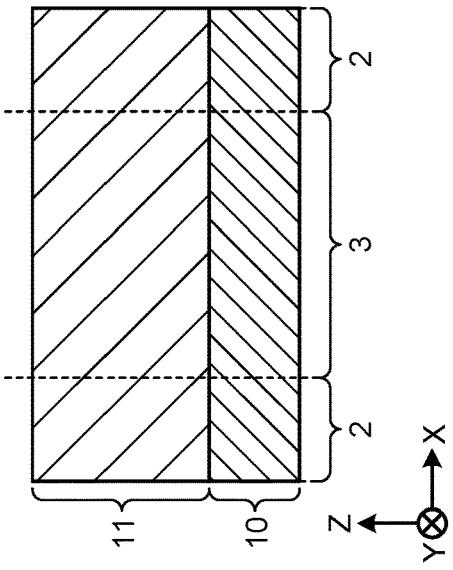
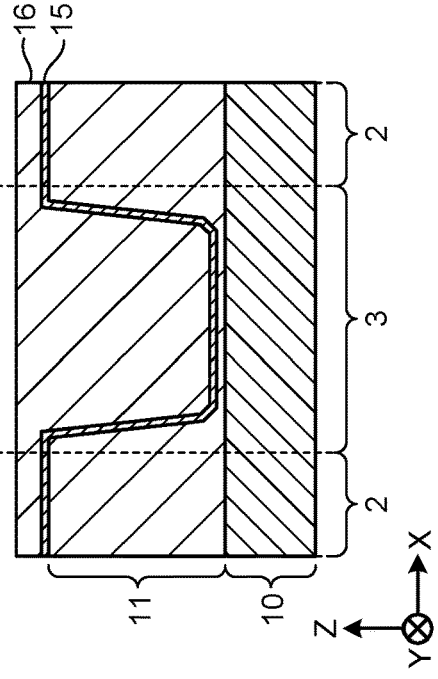

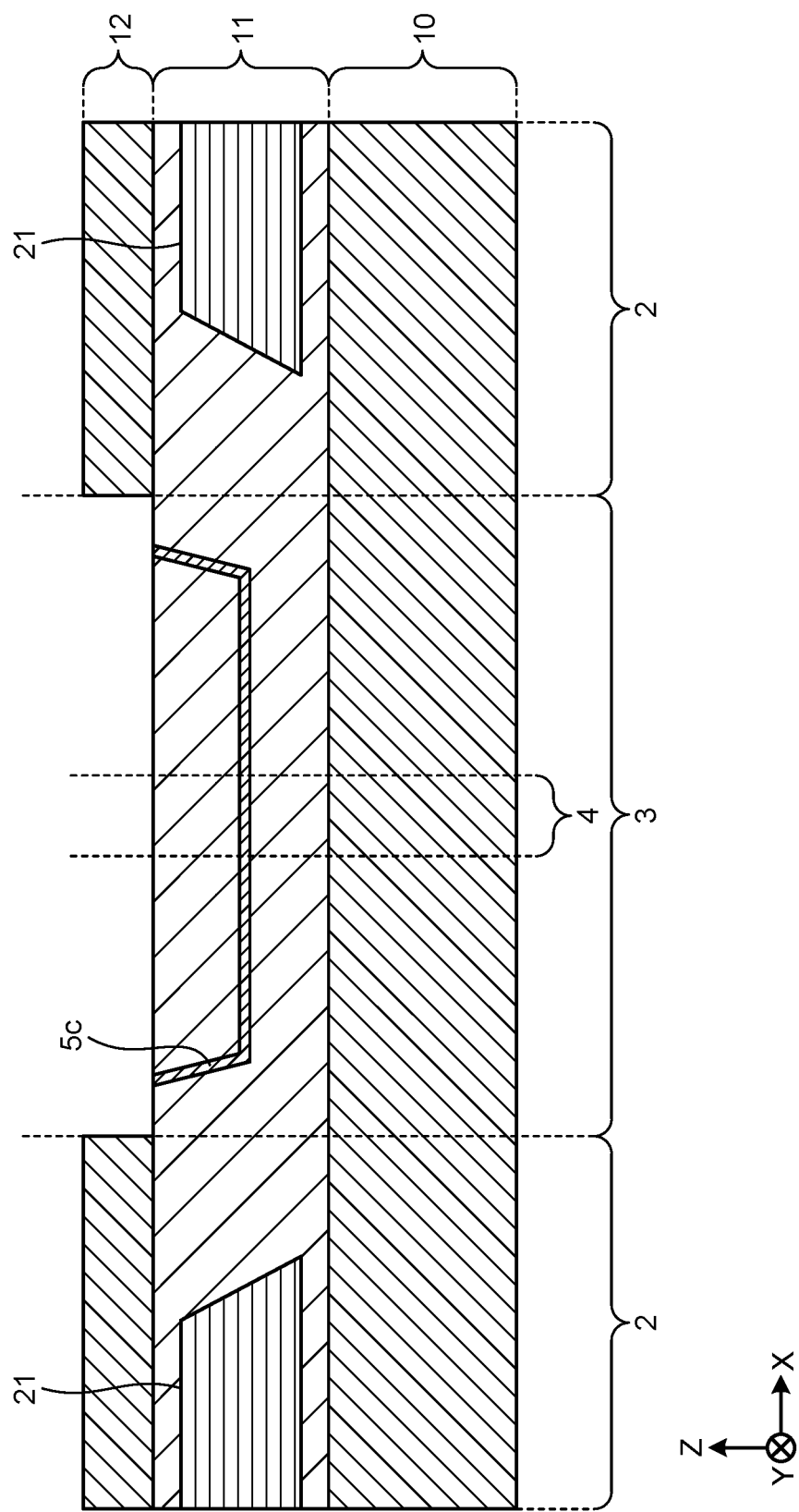

SEMICONDUCTOR WAFER AND SEMICONDUCTOR CHIP

CROSS-REFERENCE TO RELATED APPLICATIONS

This application is a continuation of and claims benefit under 35 U.S.C. § 120 to U.S. application Ser. No. 17/014,842, filed Sep. 8, 2020, which is based upon and claims the benefit of priority under 35 U.S.C. § 119 from Japanese Patent Application No. 2020-039826, filed Mar. 9, 2020, the entire contents of each of which are incorporated herein by reference.

FIELD

Embodiments described herein relate generally to a semiconductor wafer and a semiconductor chip.

BACKGROUND

Semiconductor chips are produced by separating individual chip regions of a semiconductor wafer provided with the chip regions, for example, in a dicing step. Regions, which may be sacrificed during dicing, are provided between the chip regions. The regions provided between the chip regions may be referred to as a kerf region.

When the semiconductor wafer is diced into individual semiconductor chips, or after the individualization, a material film may be peeled off from a substrate in the kerf region. If a crack due to peeling of the material film extends from the kerf region to the chip region, it causes a defect of the semiconductor chip.

BRIEF DESCRIPTION OF THE DRAWINGS

FIG. 7 is a schematic view illustrating a structure of the semiconductor wafer of the first embodiment when the semiconductor chip is a memory chip of a NAND flash memory having a three-dimensional memory cell array;

FIGS. 10A to 10E are schematic views for explaining an example of the step of forming the guide structure of the second embodiment;

FIG. 12 is an enlarged cross-sectional view of the guide structure of the third embodiment;

FIG. 13 is a cross-sectional view of the semiconductor wafer of the third embodiment after being cut by the blade at the position of the dicing line;

FIGS. 20A to 20E are schematic views for explaining an example of the step of forming the guide structure of the fifth embodiment;

FIG. 21 is a view for explaining another example of the guide structure according to the fifth embodiment;

DETAILED DESCRIPTION

According to an embodiment, a semiconductor wafer is formed with a plurality of first regions each provided with a circuit element and a second region between the first regions. The semiconductor wafer includes a first structure in which a first embedding material is embedded in a first recess extending in a first direction perpendicular to a surface of a substrate. The first structure is between edges of the first regions and a third region that is cut in the second region when the first regions are separated.

Hereinafter, a semiconductor wafer and a semiconductor chip according to embodiments will be described in detail with reference to the accompanying drawings. It should be noted that the present invention is not limited to the embodiments.

First Embodiment

Figure 1:
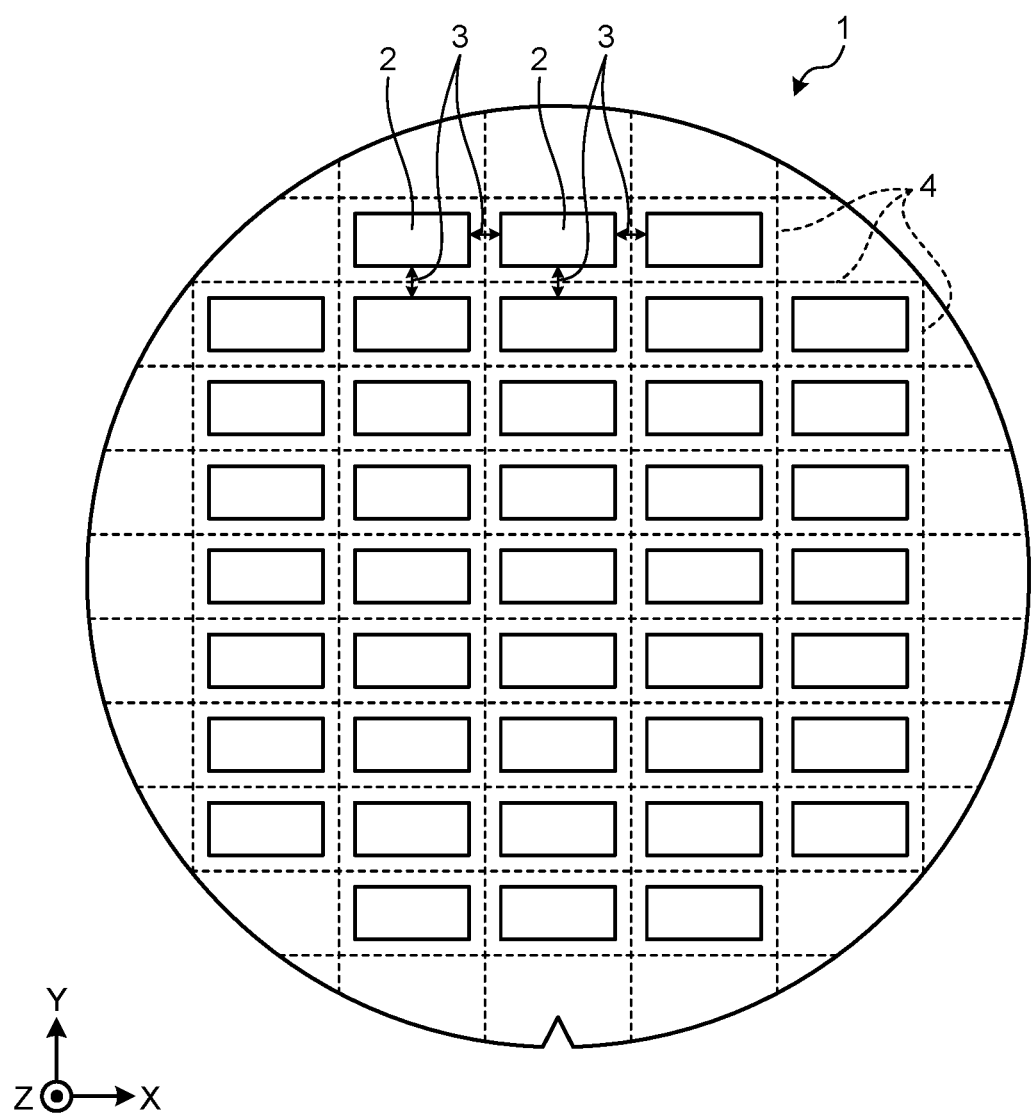
FIG. 1 is an example of a plan view of a semiconductor wafer according to a first embodiment as seen from a front surface.

FIG. 1 is an example of a plan view of a semiconductor wafer 1 of a first embodiment as seen from a front surface.

FIG. 1 and some subsequent figures indicate a coordinate system. In the coordinate system, a direction from a back surface to a front surface of the semiconductor wafer 1 is a positive direction of a Z-axis, one-side direction in a long-side direction of a chip region 2 is a positive direction of an X-axis, and one-side direction in a short-side direction of the chip region 2 is a positive direction of a Y-axis. The coordinate system is provided for convenience of description, and does not disclose or suggest that the semiconductor wafer 1 or its constituent element has a specific orientation, or is configured or operated in a specific orientation.

A plurality of chip regions 2 are formed in a matrix on the semiconductor wafer 1. In this example, each chip region 2 has a rectangular shape. A shape of each chip region 2 is not limited to this. Each chip region 2 is provided separately from the adjacent chip regions 2. A region between the chip regions 2 is a region that may be sacrificed during dicing, that is, a kerf region 3.

Dicing lines 4 are disposed in the kerf region 3. At the time of dicing, the semiconductor wafer 1 is cut by a blade along the dicing lines 4. As a result, the individual chip regions 2 are separated from each other.

The chip regions 2 are individually packaged after being separated. Each of the packaged individual chip regions 2 or each of the individual chip regions 2 before being packaged corresponds to an example of the semiconductor chip of the embodiments.

More precisely, the dicing lines 4 are regions that disappear by cutting with the blade, and have a width corresponding to a width of the blade. The width of the dicing line 4 may be wider than the width of the blade.

Each chip region 2 corresponds to the first region. The kerf region 3 corresponds to the second region. Each dicing line 4 corresponds to the third region. A Z-axis direction corresponds to the first direction perpendicular to the surface of the substrate (a silicon substrate 10 in FIG. 3).

Figure 2:
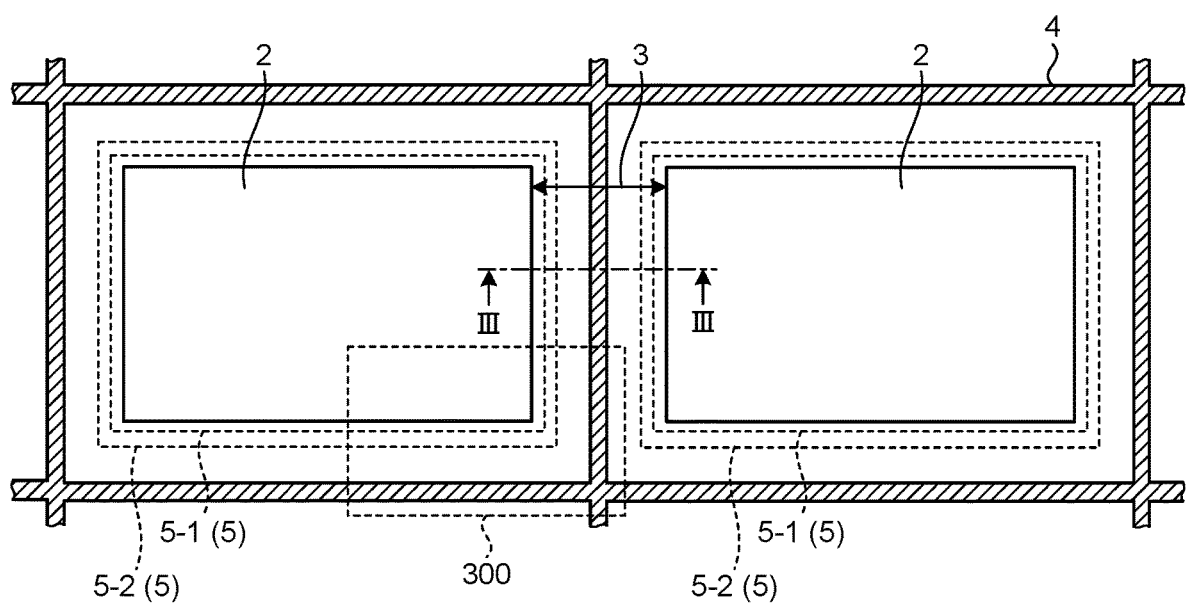
FIG. 2 is a partially enlarged plan view of the semiconductor wafer according to the first embodiment as seen from the front surface.
Figure 3:
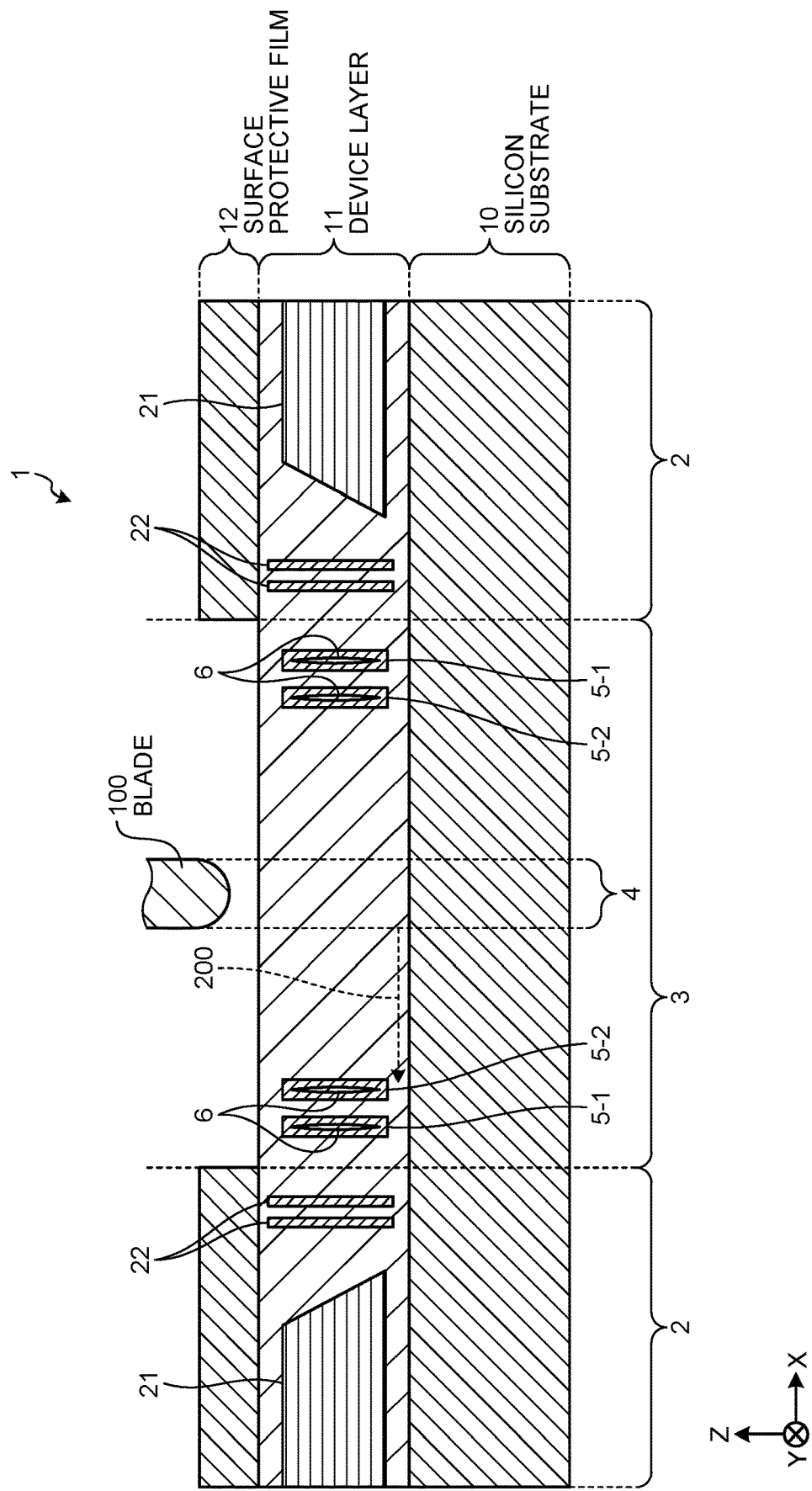
FIG. 3 is a cross-sectional view taken along a cutting line in FIG. 2.

FIG. 2 is a partially enlarged plan view of the semiconductor wafer 1 of the first embodiment as seen from the front surface. FIG. 3 is a cross-sectional view taken along a cutting line III-III in FIG. 2.

A device layer 11 is provided on the silicon substrate 10 that is a semiconductor substrate. The device layer 11 is made of one or more material films formed on the silicon substrate 10 by film formation or the like. In each chip region 2, a circuit element 21 is formed in the device layer 11.

The circuit element 21 includes, for example, a memory cell array or a peripheral circuit that operates the memory cell array. Specific examples of the circuit element 21 are not limited to them.

A surface of each chip region 2 is coated with a surface protective film 12. Alternatively, the surface protective film 12 may be omitted.

At the time of dicing, the material film is peeled off at a boundary of the material film, so that a crack extending parallel to the silicon substrate 10 from a cut portion may occur. In the first embodiment, in order to prevent the crack from entering the chip region 2, a guide structure 5 is embedded in a region between the dicing line 4 and an edge of the chip region 2.

The guide structure 5 is, for example, a wall-like structure surrounding the chip region 2. In an example of FIGS. 2 and 3, double guide structures 5 are provided around the chip region 2. The guide structure 5 provided on the chip region 2 side of the double guide structures 5 is referred to as a guide structure 5-1. The guide structure 5 provided on the dicing line 4 side of the double guide structures 5 is referred to as a guide structure 5-2.

A single guide structure 5 may be provided around the chip region 2, or triple or more guide structures 5 may be provided. The guide structure 5 may be formed of a plurality of columnar structures, and the columnar structures may be arranged around the chip region 2 so as to surround the chip region 2. An upper end of the guide structure 5 may be exposed on the surface of the semiconductor wafer 1. A lower end of the guide structure 5 may reach the silicon substrate 10.

The guide structure 5 has a void 6 therein. The guide structure 5 is formed by forming a recess extending in the Z-axis direction in the device layer 11 and depositing an embedding material in the recess. The embedding material is deposited in the recess, for example, by chemical vapor deposition (CVD) or sputtering. An opening size of the recess is determined so that the void easily occurs when the embedding material is deposited by these methods. As a result, the void 6 is formed inside the guide structure 5. A method for filling the embedding material is not limited to chemical vapor deposition and sputtering.

Since the guide structure 5 has the void 6 therein, the guide structure 5 is weaker than a structure of circumference (specifically, a film in direct contact with the guide structure 5) of the guide structure 5, and is easily broken by a stress applied to the circumference of the guide structure 5. Therefore, when the crack occurs during dicing and the crack extends in a direction of an arrow 200, the guide structure 5 is broken, so that the crack can be guided to extend in the Z-axis direction in which the guide structure 5 extends (more accurately, the positive direction of the Z-axis). This can prevent the crack from extending to an inside of the chip region 2.

Figure 4:
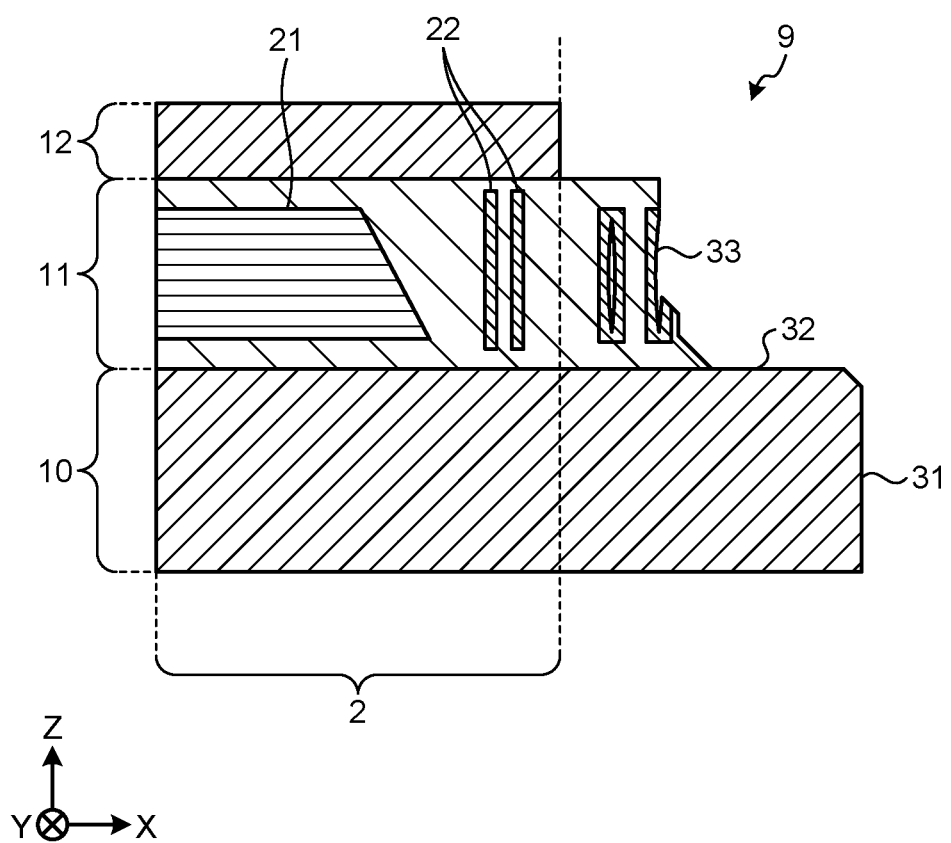
FIG. 4 is a cross-sectional view of the semiconductor wafer of the first embodiment after being cut by a blade at a position of a dicing line of FIG. 3.

FIG. 4 is a cross-sectional view of the semiconductor wafer 1 of the first embodiment after being cut by a blade 100 at a position of the dicing line 4 of FIG. 3.

From FIG. 4, it can be seen that the crack extending parallel to the silicon substrate 10 toward the chip region 2 has changed its extension direction to the positive direction of the Z-axis at the outer guide structure 5-2 of the double guide structures 5, so that the crack can be prevented from extending toward the chip region 2 from the guide structure 5-2. That is, the crack is prevented from extending parallel to the silicon substrate 10 by the guide structure 5-2.

If the guide structure 5-2 could not prevent the crack from extending parallel to the silicon substrate 10, that is, if the guide structure 5-2 did not function, the crack can be prevented from extending by the guide structure 5-1 provided on the chip region 2 side of the guide structure 5-2. By providing the guide structure 5 in multiple layers, it is possible to reduce possibility of failure in preventing the crack from extending.

When the crack extending parallel to the silicon substrate 10 is prevented by the guide structure 5, an outer peripheral portion of a semiconductor chip 9 includes a cut surface 31 cut by the blade 100, a release surface 32 parallel to the silicon substrate 10 caused by the crack (in other words, peeling of the material film) extending parallel to the silicon substrate 10, and a fracture surface 33 caused by fracture of the guide structure 5.

Figure 5:
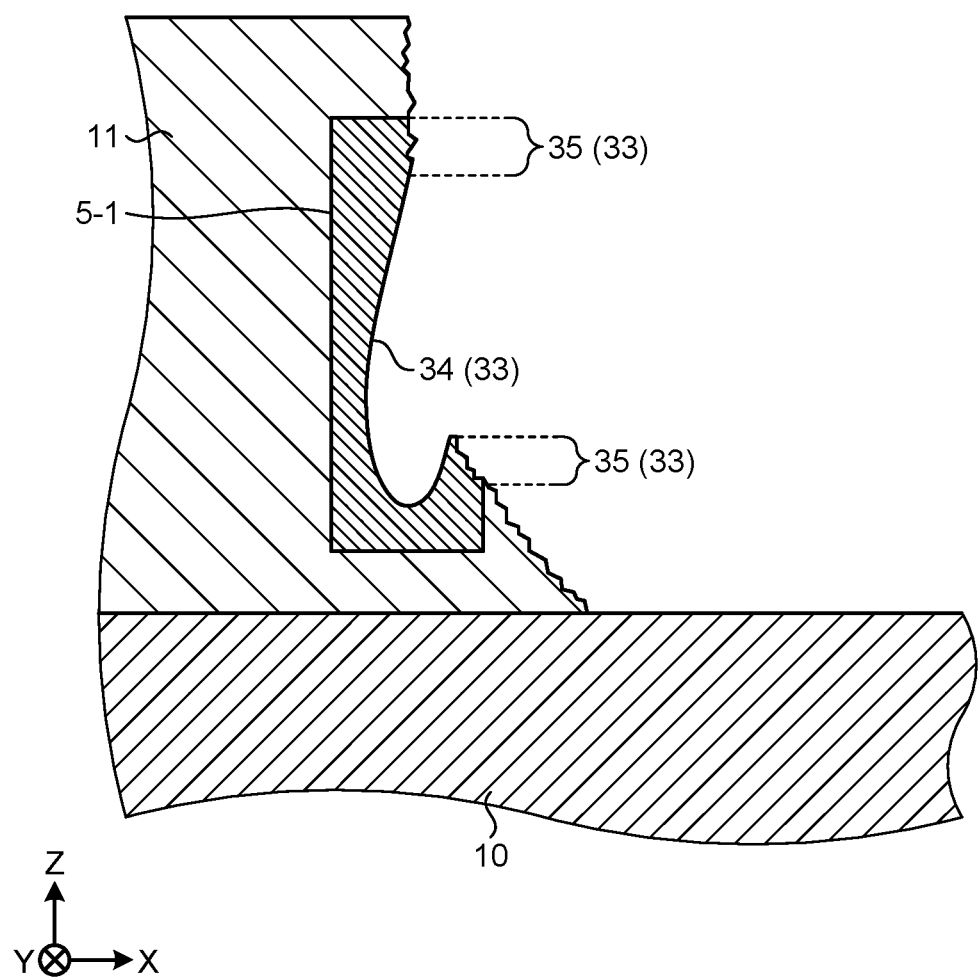
FIG. 5 is an enlarged view of a fracture surface of the first embodiment.

FIG. 5 is an enlarged view of the fracture surface 33 of the first embodiment.

Since the fracture occurs in the guide structure 5, the embedding material of the guide structure 5 is exposed at the fracture surface 33. The fracture surface 33 includes an inner wall portion 34 of the void 6. When the embedding material is deposited by, for example, chemical vapor deposition or sputtering, surface roughness of the inner wall portion 34 of the void 6 is smoother than the surface roughness of a fractured portion 35 different from the inner wall portion 34 of the fracture surface 33.

Since the inner wall portion 34 was originally a part of the void 6, a film of the embedding material remaining on the fracture surface 33 is thinner at a central portion of the inner wall portion 34 in the Z-axis direction as compared with both ends of the inner wall portion 34 in the Z-axis direction. Therefore, the inner wall portion 34 has an inclined surface that inclines from the chip region 2 side to the dicing line 4 side or an inclined surface that inclines from the dicing line 4 side to the chip region 2 side as it goes in one direction of the Z-axis direction.

The film of the embedding material of the guide structure 5 exposed on the fracture surface 33 corresponds to a first film extending in the first direction exposed in the outer peripheral portion of the semiconductor chip 9.

As illustrated in FIGS. 3 and 4, a wall-like edge seal 22 is provided inside the edge of each chip region 2. In this example, double edge seals 22 are provided, but a single or triple or more edge seals 22 can be provided. Even when the guide structure 5 does not function and the crack extending parallel to the silicon substrate 10 enters the chip region 2, the edge seal 22 prevents the crack from reaching the circuit element 21, so that the circuit element 21 can be protected.

As mentioned above, the guide structure 5 is formed by depositing the embedding material in the recess. Some or all of a process of forming the recess for the guide structure 5 and a process of depositing the embedding material can be performed in the same process as a process of processing the chip region 2.

FIGS. 6A to 6D are schematic views for explaining an example of a step of forming the guide structure 5 of the first embodiment. In this figure, the edge seal 22 and the guide structure 5 are formed in the same step.

Figure 6A:
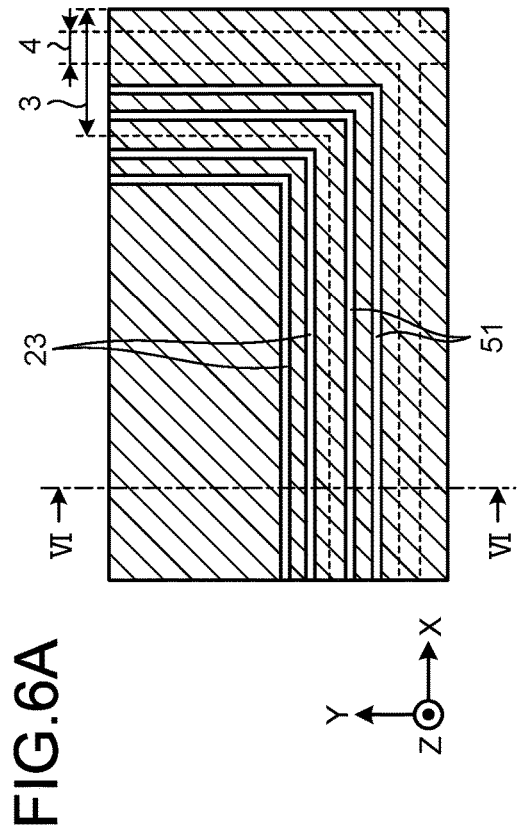
FIGS. 6A to 6D are schematic views for explaining an example of a step of forming a guide structure of the first embodiment.
Figure 6D:
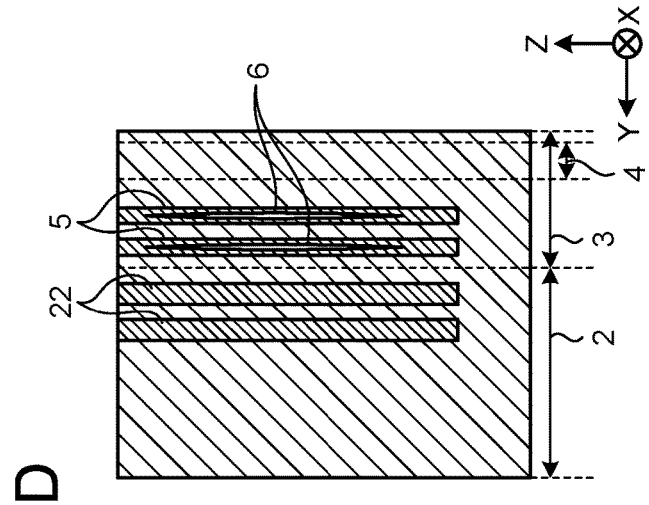

After the circuit element 21 is formed by a predetermined step, a recess 23 for the edge seal 22 and a recess 51 for the guide structure 5 are formed simultaneously in an etching step. FIG. 6A is a plan view of a partial region of the semiconductor wafer 1 after the recess 23 and the recess 51 are formed, as seen from the front surface of the semiconductor wafer 1. FIG. 6B is a cross-sectional view of the semiconductor wafer 1 of FIG. 6A taken along a cutting line VI-VI.

A size of an opening of the recess 51 (the opening size), particularly a width W1, is determined so that the void 6 occurs during deposition of the embedding material. A width W2 of the recess 23 for the edge seal 22 may be the same as the width W1 or may be different from the width W1.

Subsequently, a deposition step is performed. That is, an embedding material 7 is deposited on the semiconductor wafer 1 formed with the recess 51 and the recess 23 by, for example, chemical vapor deposition or sputtering.

In the example of FIGS. 6A to 6D, the width W1 of the opening of the recess 51 is preset to a value such that the void 6 is formed. Thus, before filling of the embedding material 7 into the recess 51 is completed, the opening of the recess 51 is closed with the embedding material 7, and as a result, the void 6 is formed in the recess 51.

Figure 6C:
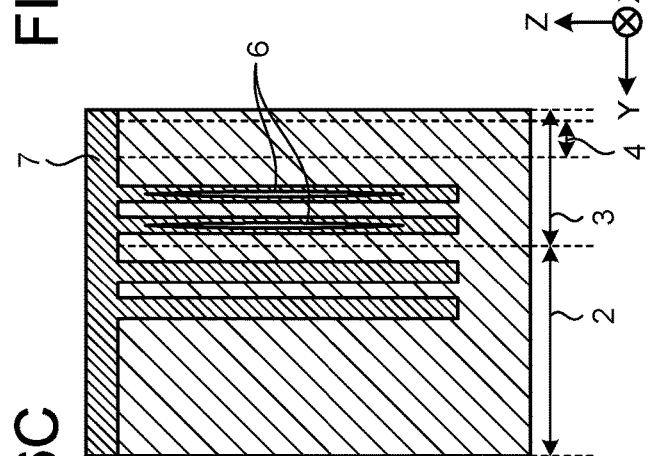
Figure 6B:
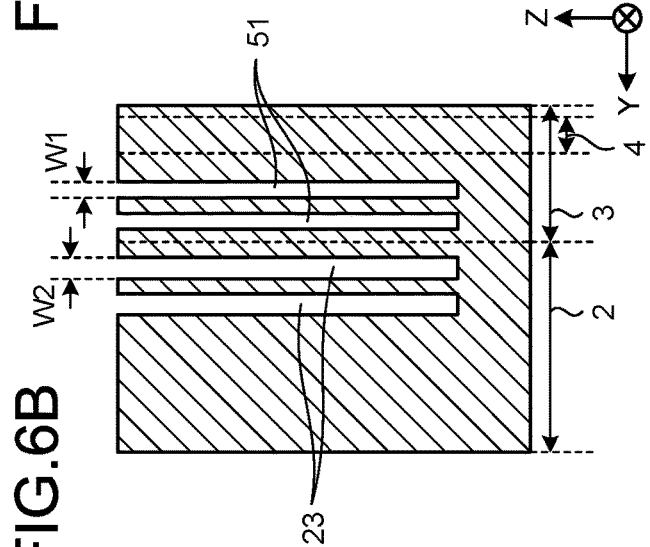

By the deposition step, as illustrated in FIG. 6C, the semiconductor wafer 1 is in a state where the embedding material 7 is deposited on the surface. The recess 23 is filled with the embedding material 7. The recess 51 is not completely filled with the embedding material 7 and has the void 6.

Thereafter, the film of the embedding material 7 formed on the surface of the semiconductor wafer 1 is removed by, for example, chemical mechanical polishing (CMP) or the like, and thus the semiconductor wafer 1 is formed with the edge seal 22 and the guide structure 5 as illustrated in FIG. 6D.

In this way, the guide structure 5 can be formed by a step common to the edge seal 22. This makes it possible to form the guide structure 5 without newly adding a dedicated step for forming the guide structure 5.

In the example illustrated in FIGS. 6A to 6D, the recess 51 corresponds to the first recess. The edge seal 22 corresponds to a second structure that is a structure formed in the same step as the step of forming the guide structure 5. The recess 23 corresponds to a second recess. The embedding material 7 corresponds to the first embedding material and a second embedding material.

According to the example illustrated in FIGS. 6A to 6D, the guide structure 5 is formed by the step common to the edge seal 22 at both the etching step and the deposition step. Out of the steps of forming the guide structure 5, only one of the etching step and the deposition step may be common to the step of forming the edge seal 22.

The structure formed in the same step as the step of forming the guide structure 5, that is, the second structure, is not limited to the edge seal 22. Variation of the structure formed in the same process as the process of forming the guide structure 5 will be described below.

FIG. 7 is a schematic view illustrating a structure of the semiconductor wafer 1 of the first embodiment when the semiconductor chip 9 is a memory chip of a NAND flash memory having a three-dimensional memory cell array.

The chip region 2 includes a peripheral circuit CIR and a memory unit MEM. The peripheral circuit CIR and the memory unit MEM correspond to the circuit element 21.

The peripheral circuit CIR includes a transistor TR, wiring, and the like. The peripheral circuit CIR is covered with an insulating layer 111. A source line SL is disposed on the insulating layer 111. A plurality of word lines WL are stacked on the source line SL.

A plurality of pillars PL that penetrate the word lines WL in a stacking direction (that is, the Z-axis direction) are arranged in the word lines WL. A plurality of memory cells are formed at intersections of the pillars PL and the word lines WL. Thus, the memory unit MEM in which the memory cells are three-dimensionally arranged is formed.

In the memory unit MEM, a contact C1 that connects the peripheral circuit CIR below the memory unit MEM and upper wiring and the like above the memory unit MEM is disposed. The peripheral circuit CIR may be disposed in a stepped region of the word line WL described below. In the stepped region, the contact C1 that connects the upper wiring and the like and the peripheral circuit CIR may be disposed.

The ends of the word lines WL are formed in a step shape. At the end of each word line WL, a contact C2 that connects the word line WL and the upper wiring and the like is disposed. Thus, the word lines WL stacked in multiple layers can be individually drawn out.

The guide structure 5 can be formed simultaneously with any structure as long as the structure has a high aspect ratio.

For example, the guide structure 5 may be formed simultaneously in a step of forming the contact C1. The guide structure 5 may be formed together with the edge seal 22 in the step of forming the contact C1.

The guide structure 5 may be formed simultaneously with the contact C2. The guide structure 5 may be formed simultaneously in any step of forming the contact C2.

The guide structure 5 may be formed simultaneously in a step of forming the pillar PL.

A stacked body of the word lines WL is divided by a slit ST reaching the source line SL in some cases. The guide structure 5 may be formed simultaneously in a step of forming the slit ST.

As described above, according to the first embodiment, the guide structure 5 that is the first structure in which the embedding material is embedded in the recess extending in the Z-axis direction perpendicular to the surface of the silicon substrate 10 is provided between the edge of the chip region 2 and the dicing line 4 in the kerf region 3.

Thus, since extension of the crack due to the peeling of the material film can be guided in the Z-axis direction by the guide structure 5, it is possible to prevent the crack from extending to the chip region 2.

The guide structure 5 has a structure in which the device layer 11 extends in the Z-axis direction.

According to the first embodiment, the void 6 is formed in the embedding material constituting the guide structure 5.

Thus, the guide structure 5 is weaker than the structure of circumference (in other words, the film in direct contact with the guide structure 5) of the guide structure 5, and is easily broken by the stress applied to the circumference. Thus, the guide structure 5 can guide the crack in the Z-axis direction in which the guide structure 5 extends.

According to the first embodiment, the chip region 2 includes the second structure in which the embedding material is embedded in the recess extending in the Z-axis direction. Then, the guide structure 5 that is the first structure and the second structure are formed by the common step.

This makes it possible to form the guide structure 5 without newly adding a dedicated step for forming the guide structure 5.

The second structure may be the edge seal 22 or any structure having a high aspect ratio other than the edge seal 22. The edge seal 22 is a wall-like structure provided inside the chip region 2 along the edge of the chip region 2.

When the second structure is the edge seal 22, the embedding material of the guide structure 5 and the embedding material of the edge seal 22 can have the same composition. However, the embedding material of the guide structure 5 and the embedding material of the second structure do not necessarily have to have the same composition.

According to the first embodiment, for example, the guide structure 5 is a wall-like structure formed to surround the chip region 2. However, as described above, the guide structure 5 does not necessarily have to be the wall-like structure. The guide structure 5 may be the columnar structures and may be arranged around the chip region 2 so as to surround the chip region 2.

According to the first embodiment, in the outer peripheral portion of the semiconductor chip 9, the cut surface 31 extending in the Z-axis direction, the release surface 32 perpendicular to the Z-axis direction, and the fracture surface 33 that is the first film extending in the Z-axis direction and exposed, are formed.

Since the fracture surface 33 is broken at the void 6, the inner wall portion 34 of the void 6 is included therein. The inner wall portion 34 has the inclined surface that inclines from the chip region 2 side to the dicing line 4 side or the inclined surface that inclines from the dicing line 4 side to the chip region 2 side as it goes in one direction of the Z-axis direction.

Second Embodiment

In a second embodiment, another example of the first structure will be described. The first structure of the second embodiment will be referred to as a guide structure 5a. The guide structure 5a is, for example, doubly provided. The guide structure 5a provided on the chip region 2 side is referred to as a guide structure 5a-1, and the guide structure 5a provided on the dicing line 4 side is referred to as a guide structure 5a-2. A single guide structure 5a may be provided, or triple or more guide structures 5a may be provided.

Figure 8:
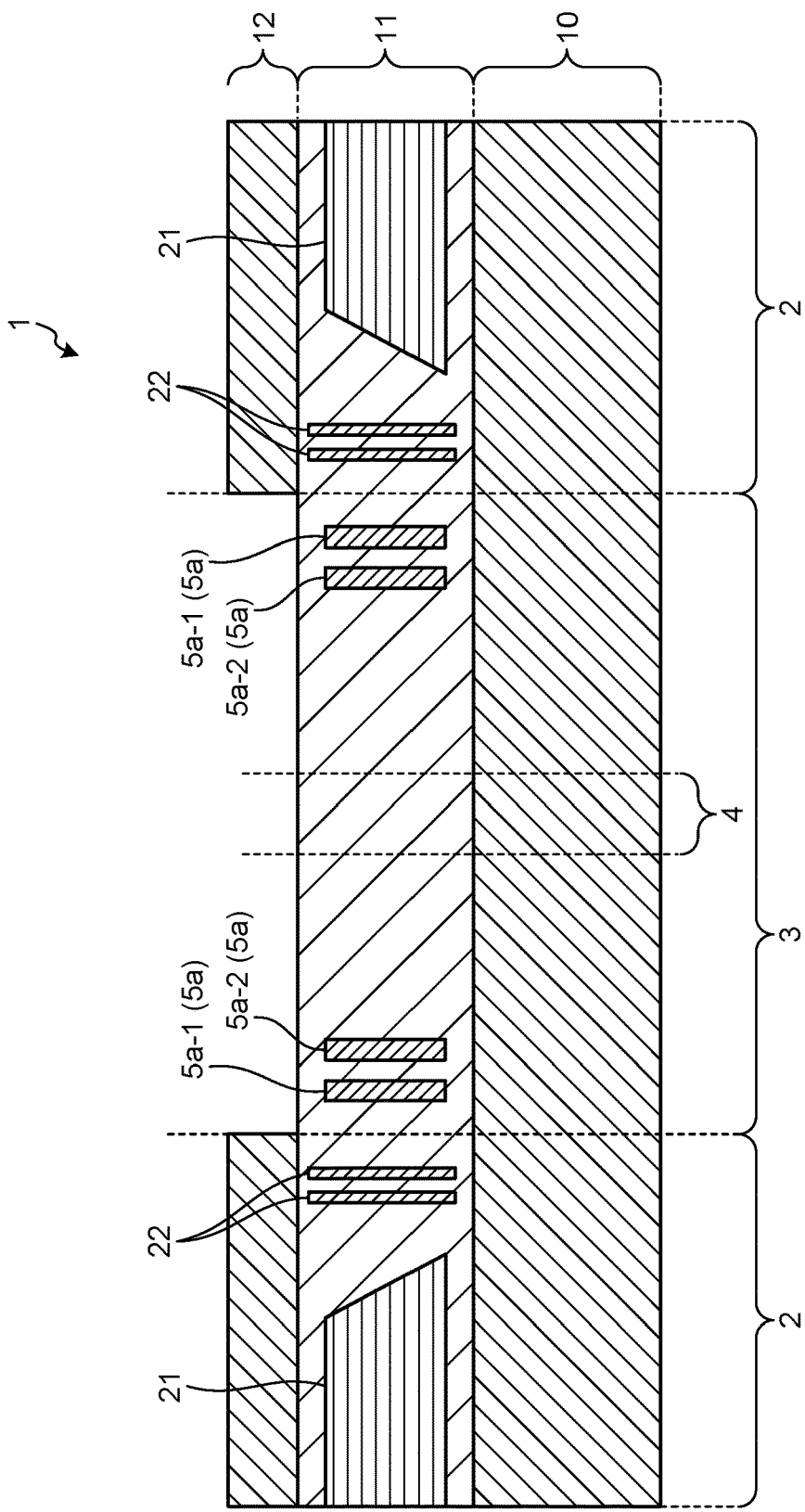
FIG. 8 is a view for explaining an example of the guide structure of a second embodiment.

FIG. 8 is a view for explaining an example of the structure of the guide structure 5a according to the second embodiment. This figure is a cross-sectional view of the semiconductor wafer 1 taken along the same cutting line as in FIG. 3.

In the second embodiment, the guide structure 5a has a shape that extends in a thickness direction of the semiconductor wafer 1 in the device layer 11 as in the guide structure 5 of the first embodiment. The guide structure 5a is made of, for example, a porous material. A material forming the guide structure 5a may be any material having lower toughness (that is, resistance to brittle fracture) than that of a film in direct contact with the guide structure 5a, and may be a material other than the porous material.

Since the guide structure 5a has lower toughness than that of a material of the structure of circumference, when the stress is applied to a vicinity of the guide structure 5a, the guide structure 5a is preferentially broken. When the crack extends to the vicinity of the guide structure 5a, the guide structure 5a is broken by the stress applied to the vicinity of the guide structure 5a. Thus, the extension direction of the crack can be guided in the Z-axis direction, and as a result, the crack can be prevented from entering the chip region 2 beyond the guide structure 5a.

Figure 9:
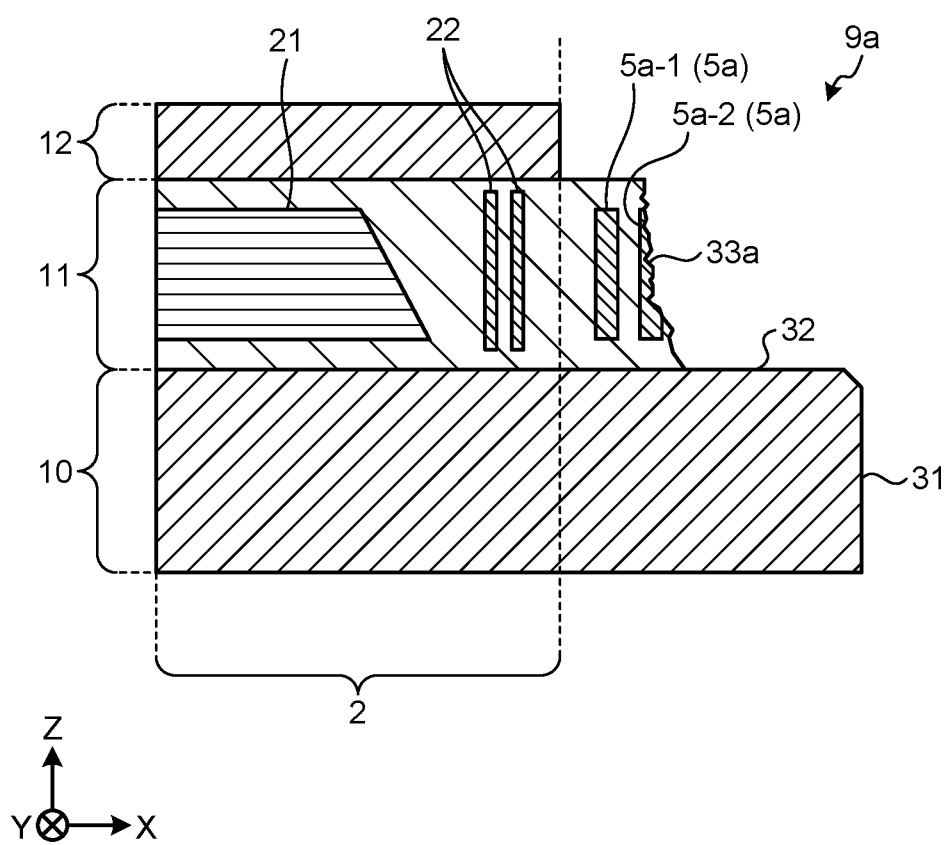
FIG. 9 is a cross-sectional view of the semiconductor wafer of the second embodiment after being cut by the blade at the position of the dicing line.

FIG. 9 is a cross-sectional view of the semiconductor wafer 1 of the second embodiment after being cut by the blade 100 at the position of the dicing line 4.

It can be seen from FIG. 9 that the crack extending parallel to the silicon substrate 10 toward the chip region 2 is prevented from extending toward the chip region 2 beyond the guide structure 5a-1 by destruction of an outer guide structure 5a-2 out of double guide structures 5a. That is, the crack is prevented from extending parallel to the silicon substrate 10 by the guide structure 5a-2.

When the crack extending parallel to the silicon substrate 10 is prevented by the guide structure 5a, an outer peripheral portion of a semiconductor chip 9a includes the cut surface 31 cut by the blade 100, the release surface 32 parallel to the silicon substrate 10 caused by the crack (in other words, peeling of the material film) extending parallel to the silicon substrate 10, and a fracture surface 33a caused by fracture of the guide structure 5a.

FIGS. 10A to 10E are schematic views for explaining an example of a step of forming the guide structure 5a of the second embodiment.

After the circuit element 21 is formed by a predetermined step, the recess 23 for the edge seal 22 and the recess 51 for the guide structure 5 are formed simultaneously in the etching step as illustrated in FIG. 10A. Here, the size of the opening of the recess 51, especially the width W3, is made larger than the size of the opening of the recess 23, especially the width W2.

Then, in the deposition step, as illustrated in FIG. 10B, the embedding material 7 is deposited. The recess 23 is filled with the embedding material 7 and closed. On the other hand, the recess 51 is not closed by the embedding material 7 because the opening has a large size. The embedding material 7 is deposited on an inner wall of the recess 51, so that a recess 53 is formed inside the recess 51.

Subsequently, the film of the embedding material 7 formed on the surface of the semiconductor wafer 1 is removed by CMP or the like, and thus the semiconductor wafer 1 is formed with the edge seal 22 and the recess 53 as illustrated in FIG. 10C.

Subsequently, an embedding material 8 made of a porous material is deposited on the semiconductor wafer 1. Thus, as illustrated in FIG. 10D, the recess 53 is filled with the embedding material 8.

Then, the film of the embedding material 8 formed on the surface of the semiconductor wafer 1 is removed by CMP or the like, and thus the structure in which the porous material is embedded in the recess 51 for the guide structure 5a can be obtained as illustrated in FIG. 10E.

The guide structure 5a can be formed simultaneously with any structure as long as the structure has a high aspect ratio, like the guide structure 5 of the first embodiment.

As described above, according to the second embodiment, the guide structure 5a, that is the first structure, has a structure in which a material having lower toughness than that of the film that is adjacent to and in direct contact with the guide structure 5a is embedded.

Thus, the guide structure 5a can guide the crack in the Z-axis direction in which the guide structure 5a extends.

The outer peripheral portion of the semiconductor chip 9a includes the fracture surface 33a that is the first film. The fracture surface 33a is made of the embedding material of the guide structure 5a.

Third Embodiment

Another example of the first structure will be described in a third embodiment. The first structure of the third embodiment will be referred to as a guide structure 5b. The guide structure 5b is, for example, doubly provided, and the guide structure 5b provided on the chip region 2 side is referred to as a guide structure 5b-1, and the guide structure 5b provided on the dicing line 4 side is referred to as a guide structure 5b-2. A single guide structure 5b may be provided, or triple or more guide structures 5b may be provided.

Figure 11:
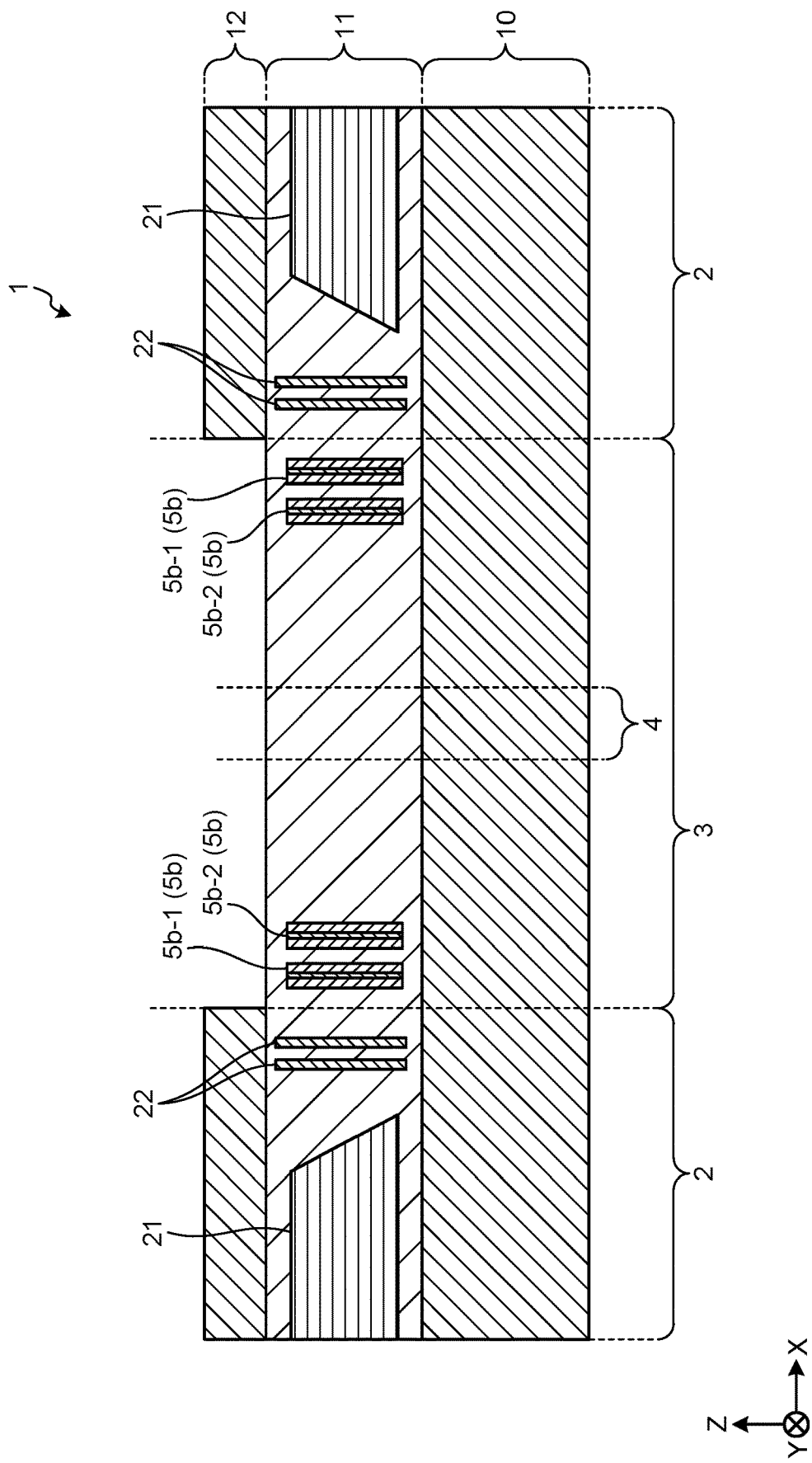
FIG. 11 is a view for explaining an example of the guide structure of a third embodiment.

FIG. 11 is a view for explaining an example of the structure of the guide structure 5b according to the third embodiment. This figure is a cross-sectional view of the semiconductor wafer 1 taken along the same cutting line as in FIG. 3. FIG. 12 is an enlarged cross-sectional view of the guide structure 5b of the third embodiment.

In the third embodiment, the guide structure 5b has a shape that extends in the thickness direction of the semiconductor wafer 1 in the device layer 11 as in the guide structure 5 of the first embodiment. That is, the recess for the guide structure 5b can be formed simultaneously when the recess for the second structure is formed by etching.

The guide structure 5b has a wall-like shape, and has a structure in which a first release layer 6a as the "first film" and a second release layer 6b as a "second film" are stacked in the thickness direction of the wall-like shape. Here, a total of three release layers 6a and 6b are stacked so that one second release layer 6b is interposed between the two first release layers 6a.

A material of each of the first release layer 6a and the second release layer 6b is selected so that adhesion between the first release layer 6a and the second release layer 6b is not more than a predetermined level. An adhesive force between the first release layer 6a and the second release layer 6b may be less than the adhesive force between the first release layer 6a and a film that is outside the recess and is adjacent to and in direct contact with the first release layer 6a. Alternatively, the adhesive force between the first release layer 6a and the second release layer 6b may be less than the adhesive force between the second release layer 6b and a film that is outside the recess and is adjacent to and in direct contact with the second release layer 6b.

Only the first release layer 6a or the second release layer 6b may be formed in the recess. At this time, the first release layer 6a or the second release layer 6b is formed such that the adhesive force between the first release layer 6a or the second release layer 6b and the film that is outside the recess and is adjacent to and in direct contact with the first release layer 6a or the second release layer 6b is less than a predetermined level.

For example, one of the first release layer 6a and the second release layer 6b is made of WSi, W, SiN, SiCN, or a-Si, and the other is made of SiO2. TEOS-SiO2 may be employed as the SiO2. These materials may be used as a constituent material of the pillar PL. Therefore, the structure in which the first release layer 6a and the second release layer 6b are stacked can be formed simultaneously when the pillar PL is formed. For the first release layer 6a and the second release layer 6b, the above materials or materials other than the above can be appropriately used. One or the other of the first release layer 6a and the second release layer 6b may be made of a material different from a material forming the circuit element 21.

When the crack parallel to the silicon substrate 10 extends to the vicinity of the guide structure 5b, in the guide structure 5b, the peeling may occur between the first release layer 6a and the second release layer 6b, or the peeling may occur between the film that is outside the recess and is in direct contact with the first release layer 6a and the first release layer 6a, so that the extension direction of the crack can be guided in the Z-axis direction. As a result, it is possible to prevent the crack from entering the chip region 2 beyond the guide structure 5b.

FIG. 13 is a cross-sectional view of the semiconductor wafer 1 of the third embodiment after being cut by the blade 100 at the position of the dicing line 4.

From FIG. 13, it can be seen that when the crack extends parallel to the silicon substrate 10 toward the chip region 2, the peeling between the first release layer 6a and the second release layer 6b occurs in the outer guide structure 5b-2 of the double guide structures 5b, so that the crack is prevented from extending toward the chip region 2 beyond the guide structure 5b-2. That is, the crack is prevented from extending parallel to the silicon substrate 10 by the guide structure 5b-2.

According to the example illustrated in FIG. 13, the peeling occurs between the second release layer 6b and the first release layer 6a on the dicing line 4 side. Therefore, a side surface of a semiconductor chip 9b includes the cut surface 31 cut by the blade 100, the release surface 32 parallel to the silicon substrate 10 caused by the crack (in other words, peeling of the material film) extending parallel to the silicon substrate 10, and a release surface 33b in which the second release layer 6b is exposed by the peeling in the guide structure 5b.

Figure 14:
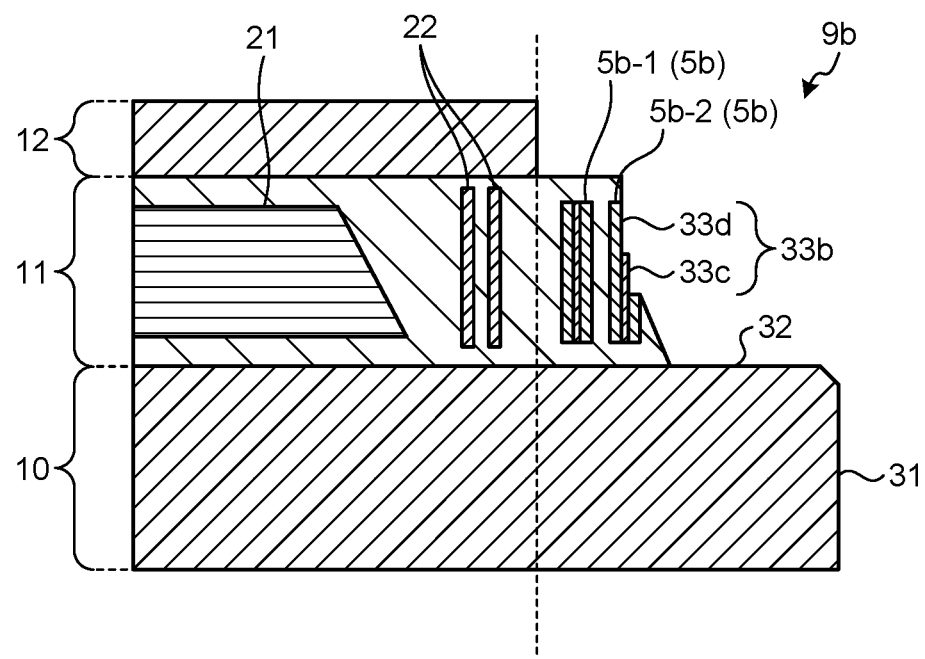
FIG. 14 is a cross-sectional view of another case of the semiconductor wafer of the third embodiment after being cut by the blade at the position of the dicing line.

FIG. 14 is a cross-sectional view of another case of the semiconductor wafer 1 of the third embodiment after being cut by the blade 100 at the position of the dicing line 4.

According to the example illustrated in FIG. 14, similarly to the example illustrated in FIG. 13, the extension of the crack is prevented by the peeling between a plurality of films forming the guide structure 5b-2. However, a position where the peeling between the films forming the guide structure 5b-2 occurs is different from the example illustrated in FIG. 13.

According to the example illustrated in FIG. 14, the peeling occurs between the second release layer 6b and the first release layer 6a on the dicing line 4 side in a part. Then, since the second release layer 6b has been broken during guiding of the crack, the peeling occurs between the first release layer 6a on the chip region 2 side and the second release layer 6b, in another part. Thus, the outer peripheral portion of the semiconductor chip 9b includes the cut surface 31 cut by the blade 100, the release surface 32 parallel to the silicon substrate 10 caused by the crack (in other words, peeling of the material film) extending parallel to the silicon substrate 10, a release surface 33c in which the second release layer 6b is exposed by the peeling in the guide structure 5b, and a release surface 33d in which the first release layer 6a on the chip region 2 side is exposed by the peeling in the guide structure 5b.

In this way, a location where the peeling between the films forming the guide structure 5b occurs can be changed. The peeling can occur between the second release layer 6b and the first release layer 6a on the dicing line 4 side, and the peeling can also occur between the first release layer 6a on the chip region 2 side and the second release layer 6b. As illustrated in FIG. 14, the peeling may occur between the second release layer 6b and the first release layer 6a on the dicing line 4 side in a part, and the peeling may occur between the first release layer 6a on the chip region 2 side and the second release layer 6b, in another part. Further, the peeling can also occur between the film that is outside the recess and is in direct contact with the first release layer 6a and the first release layer 6a.

In this way, according to the third embodiment, the peeling occurs between the films forming the guide structure 5b, between the film forming the guide structure 5b and the film that is outside the recess and is in direct contact with the first release layer 6a, or the like, and thus the extension direction of the crack can be guided in the Z-axis direction.

In the guide structure 5b in the outer peripheral portion of the semiconductor chip 9b formed by dicing, one of the films forming the guide structure 5b is exposed in some cases. When the film forming the guide structure 5b is exposed, the film is made of, for example, WSi, W, SiN, SiCN, or a-Si. The film may be made of a material having a composition other than them.

Fourth Embodiment

When the guide structure 5, 5a or 5b is deeply embedded in the semiconductor wafer 1, there is a possibility that after the crack extends along the guide structure 5, 5a or 5b, the crack extends again from the upper end of the guide structure 5, 5a or 5b toward the chip region 2. In such a case, by providing a trench recessed toward the silicon substrate 10 in a surface of the device layer 11, above the guide structure 5, 5a or 5b or between the guide structure 5, 5a or 5b and the edge of the chip region 2, the crack can be prevented from going to the chip region 2.

Figure 15:
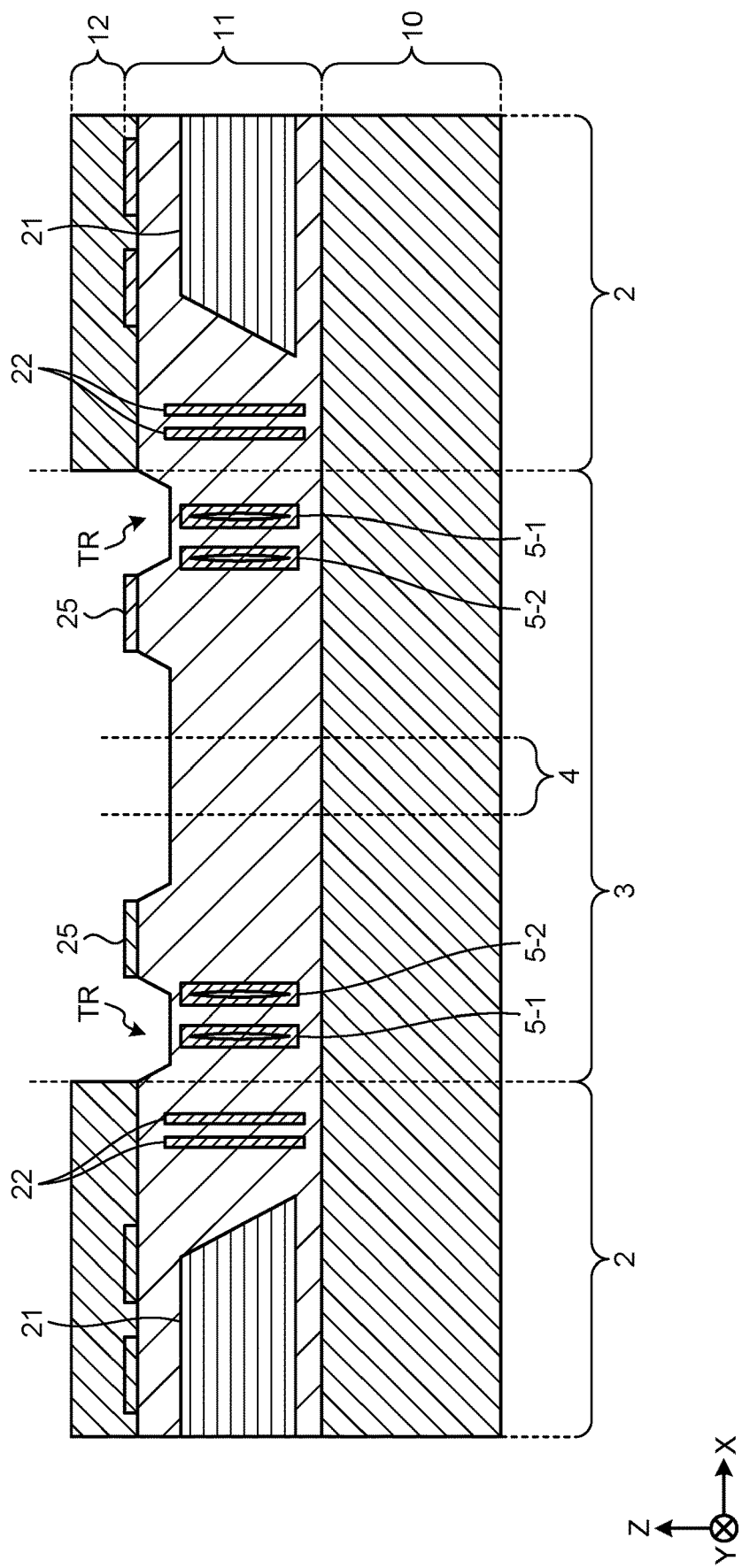
FIG. 15 is a cross-sectional view of the semiconductor wafer of a fourth embodiment.

FIG. 15 is a cross-sectional view of the semiconductor wafer 1 of a fourth embodiment. In an example illustrated in this figure, the guide structure 5 of the first embodiment is provided in the semiconductor wafer 1, however, the guide structure 5a or 5b of the second or third embodiment may be provided instead of the guide structure 5.

As illustrated in FIG. 15, in the surface of the device layer 11, a trench TR that is recessed toward the silicon substrate 10 is provided in the surface of the device layer 11 outside the chip region 2. The trench TR is provided to surround the chip region 2. The trench TR can be formed, for example, by etching using a metal layer 25 including a wiring layer provided in the surface of the device layer 11, the surface protective film 12, or the like as a mask after the guide structure 5 is formed. A surface of the material film on a side of the kerf region 3 from the metal layer 25 is below the surface of the material film covered with the protective film 12. The metal layer 25 may be disposed to surround an entire circumference of the chip region 2, or may be disposed discontinuously.

The trench TR is provided above the guide structure 5 or between the guide structure 5 and the edge of the chip region 2 in order to extend the crack to the surface of the semiconductor wafer 1 before the crack goes to the chip region 2 from the upper end of the guide structure 5.

According to the example illustrated in FIG. 15, the trench TR is located above the guide structure 5-1 on the chip region 2 side of the double guide structures 5. Therefore, regardless of which of the double guide structures 5 the crack extends from, the crack is guided to the trench TR.

Figure 16:
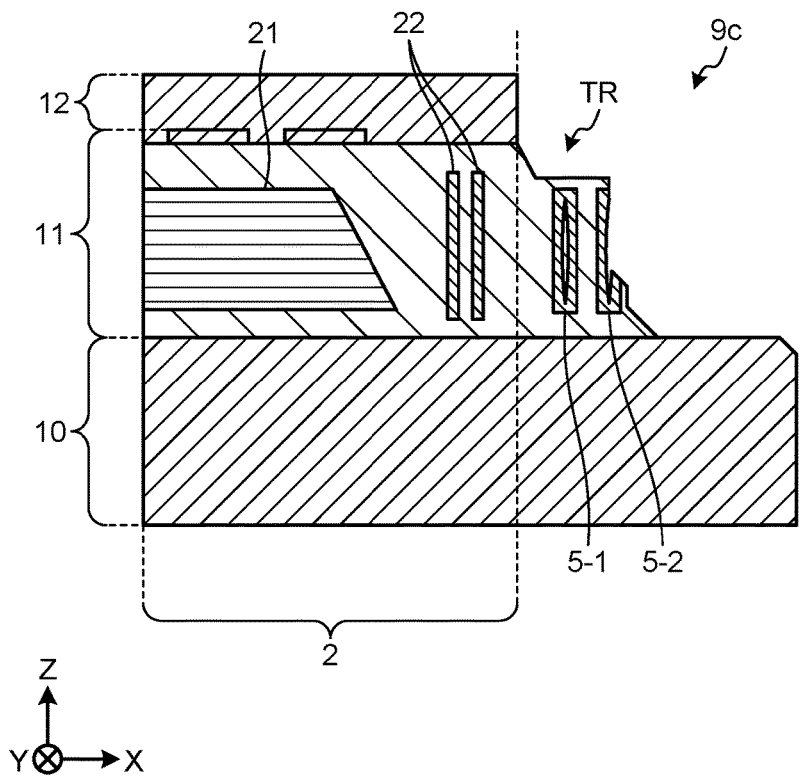
FIG. 16 is a cross-sectional view of the semiconductor wafer of the fourth embodiment after being cut by the blade at the position of the dicing line.

FIG. 16 is a cross-sectional view of the semiconductor wafer 1 of the fourth embodiment after being cut by the blade 100 at the position of the dicing line 4. According to the example illustrated in this figure, the crack extending parallel to the silicon substrate 10 toward the chip region 2 has changed the extension direction to the positive direction of the Z-axis at the outer guide structure 5-2 of the double guide structures 5. After the crack has passed the upper end of the guide structure 5-2, the crack has extended toward a bottom of the trench TR instead of the chip region 2, so that the semiconductor chip 9c has been separated. That is, the crack is prevented from extending to the chip region 2.

As described above, by providing the trench TR recessed toward the silicon substrate 10 in the surface of the device layer 11, above the guide structure 5, 5a or 5b or between the guide structure 5, 5a or 5b and the edge of the chip region 2, the crack can be further prevented from extending to the chip region 2.

Fifth Embodiment

Figure 17:
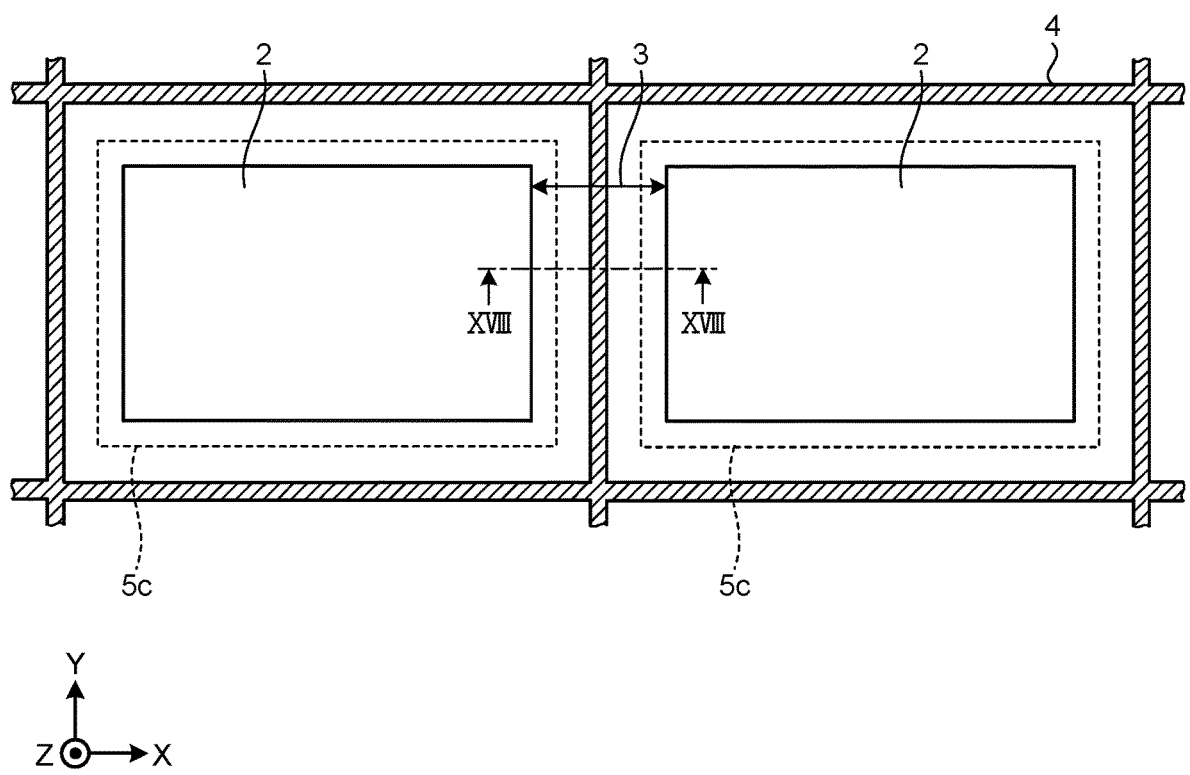
FIG. 17 is a partially enlarged plan view of the semiconductor wafer of a fifth embodiment as seen from the front surface.
Figure 18:
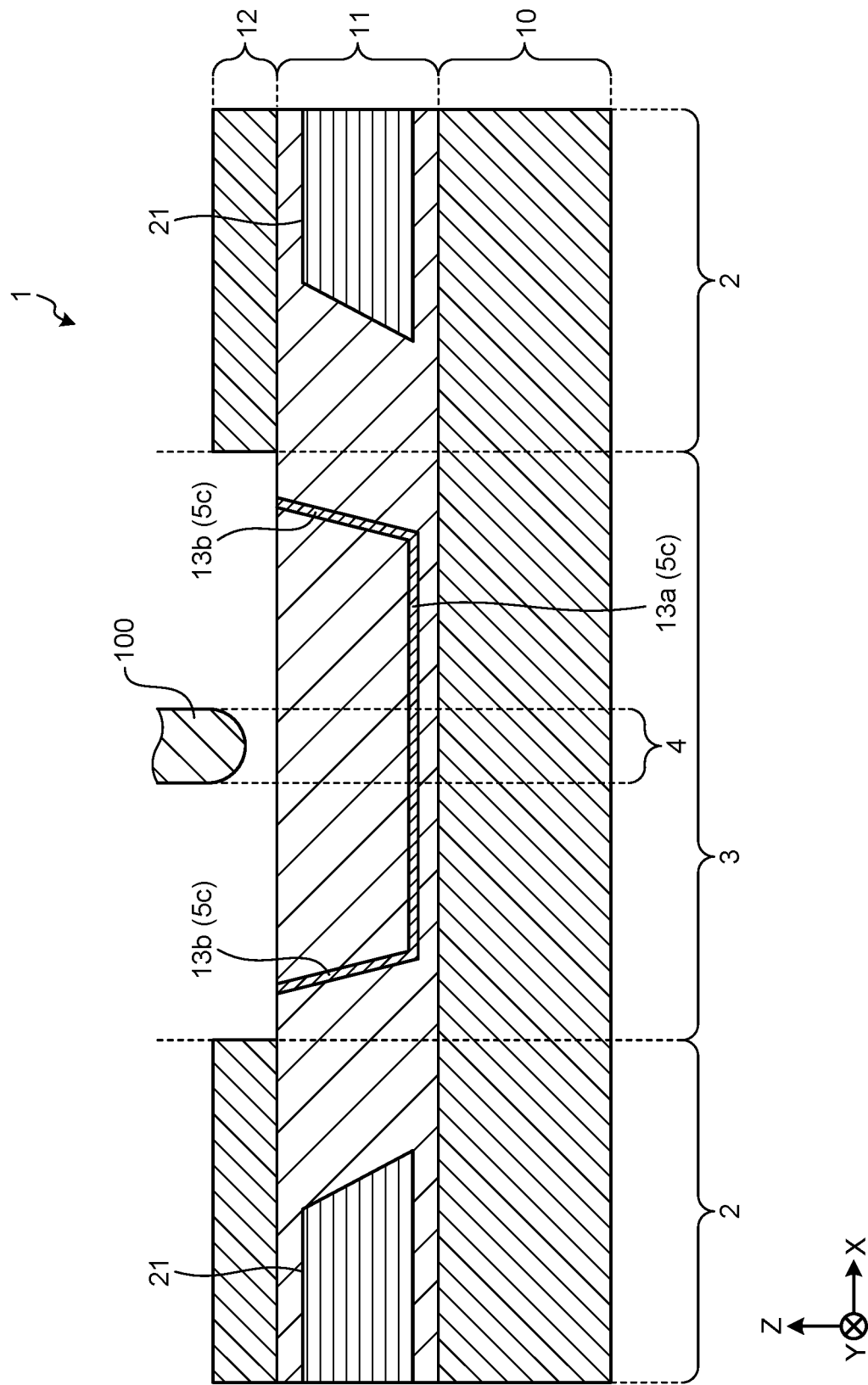
FIG. 18 is a cross-sectional view taken along a cutting line XVIII-XVIII in FIG. 17.

FIG. 17 is a partially enlarged plan view of the semiconductor wafer 1 of a fifth embodiment as seen from the front surface. FIG. 18 is a cross-sectional view taken along a cutting line XVIII-XVIII in FIG. 17.

According to the example illustrated in FIGS. 17 and 18, a guide structure 5c having a width across the dicing line 4 is embedded in the kerf region 3.

The guide structure 5c includes a bottom wall 13a and two side walls 13b. The bottom wall 13a extends in a direction in which the dicing line 4 extends. The bottom wall 13a has a width wider than that of the dicing line 4 and is disposed in the device layer 11 so as to be across the dicing line 4. The side walls 13b are respectively connected to both ends in a width direction of the bottom wall 13a, that is, in a direction perpendicular to the direction in which the dicing line 4 extends on an XY-plane. Since the guide structure 5c is formed of the bottom wall 13a and the side walls 13b provided at the both ends of the bottom wall 13a, the guide structure 5c has a U-shaped cross-section.

Since the two side walls 13b are provided at the ends of the bottom wall 13a extending in the direction in which the dicing line 4 extends, the side walls 13b can be considered as a wall-like structure surrounding the chip region 2.

According to the example illustrated in FIG. 18, the side wall 13b has a structure inclined from the dicing line 4 side to the chip region 2 side as it goes upward in the Z-axis direction, but a structure of the side wall 13b is not limited to this. The side wall 13b does not need to be inclined. Further, the side wall 13b may be inclined from the chip region 2 side to the dicing line 4 side as it goes upward in the Z-axis direction.

The guide structure 5c is, for example, a single release layer formed of a material selected so that an adhesive force with a material of the device layer 11 is not more than a predetermined level.

Alternatively, the guide structure 5c may be a film formed of a material having lower toughness (that is, resistance to brittle fracture) than that of a film in direct contact with the guide structure 5c, for example, the porous material. That is, the guide structure 5c may be made of the same material as that of the guide structure 5a of the second embodiment.

Alternatively, the guide structure 5c may have a structure in which two or more release layers are stacked in the thickness direction, specifically, the same structure as the guide structure 5b of the third embodiment.

Therefore, when the crack extending parallel to the silicon substrate 10 occurs during dicing, first, the crack extends along the bottom wall 13a. Then, when the crack reaches the end of the bottom wall 13a, the extension direction of the crack changes and extends along the side wall 13b. That is, the guide structure 5c can guide the crack to extend in the Z-axis direction. This can prevent the crack from extending to an inside of the chip region 2.

Figure 19:
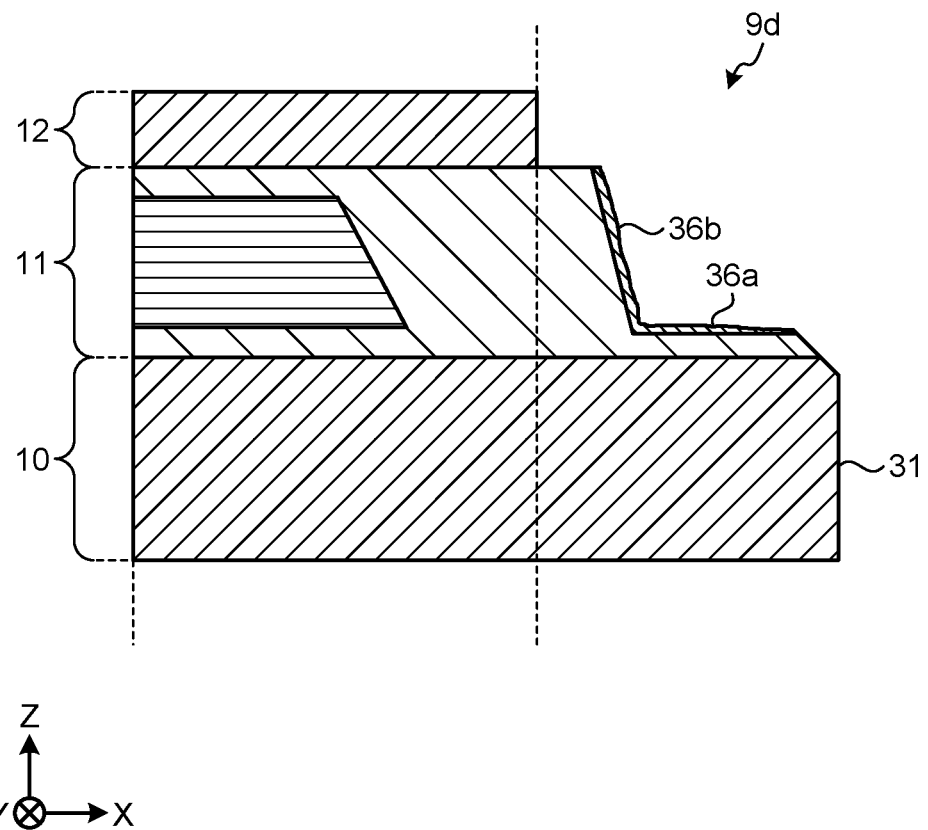
FIG. 19 is a cross-sectional view of the semiconductor wafer of the fifth embodiment after being cut by the blade at the position of the dicing line of FIG. 18.

FIG. 19 is a cross-sectional view of the semiconductor wafer 1 of the fifth embodiment after being cut by the blade 100 at the position of the dicing line 4 of FIG. 18. In the description for this figure and subsequent figures, as an example, it is assumed that the guide structure 5c is made of the same material as the guide structure 5a of the second embodiment, that is, the porous material.

It can be seen from FIG. 19 that since the crack extends while breaking the guide structure 5c, the crack is prevented from extending to the inside of the chip region 2. Since the crack has extended in this way, an outer peripheral portion of a semiconductor chip 9d includes the cut surface 31 cut by the blade 100, the fracture surface 36a of the bottom wall 13a caused by the crack having extended while breaking the bottom wall 13a, and the fracture surface 36b of the side wall 13b caused by the crack having extended while breaking the side wall 13b.

A method for forming the guide structure 5c is not limited to a particular method. FIGS. 20A to 20E are schematic views for explaining an example of a step of forming the guide structure 5c of the fifth embodiment.

For example, as illustrated in FIG. 20A, in a state where the device layer 11 is formed, the step of forming the guide structure 5c starts. First, as illustrated in FIG. 20B, a recess 54 is formed in the kerf region 3. A method for forming the recess 54 is not limited to a particular method. For example, a processed region of the semiconductor wafer 1 is protected by resist 14, and then the recess 54 is formed by reactive ion etching (RIE), wet etching, or the like.

Subsequently, the porous material is deposited in the recess 54 by film formation. Thus, as illustrated in FIG. 20C, a film 15 made of the porous material is formed on the inner wall of the recess 54.

Subsequently, as illustrated in FIG. 20D, an embedding material 16 is deposited in the recess 54. Thereafter, the film 15 and a film of the embedding material 16 formed on the surface of the semiconductor wafer 1 are removed by, for example, chemical mechanical polishing or the like, so that the guide structure 5c is completed as illustrated in FIG. 20E.

The structure of the guide structure 5c according to the fifth embodiment is not limited to the above-described structure.

FIGS. 21 to 25B are views for explaining other examples of the guide structure 5c according to the fifth embodiment.

As illustrated in FIG. 21, the guide structure 5c may be provided at a position shallower than that of the example illustrated in FIG. 18.

Figure 22:
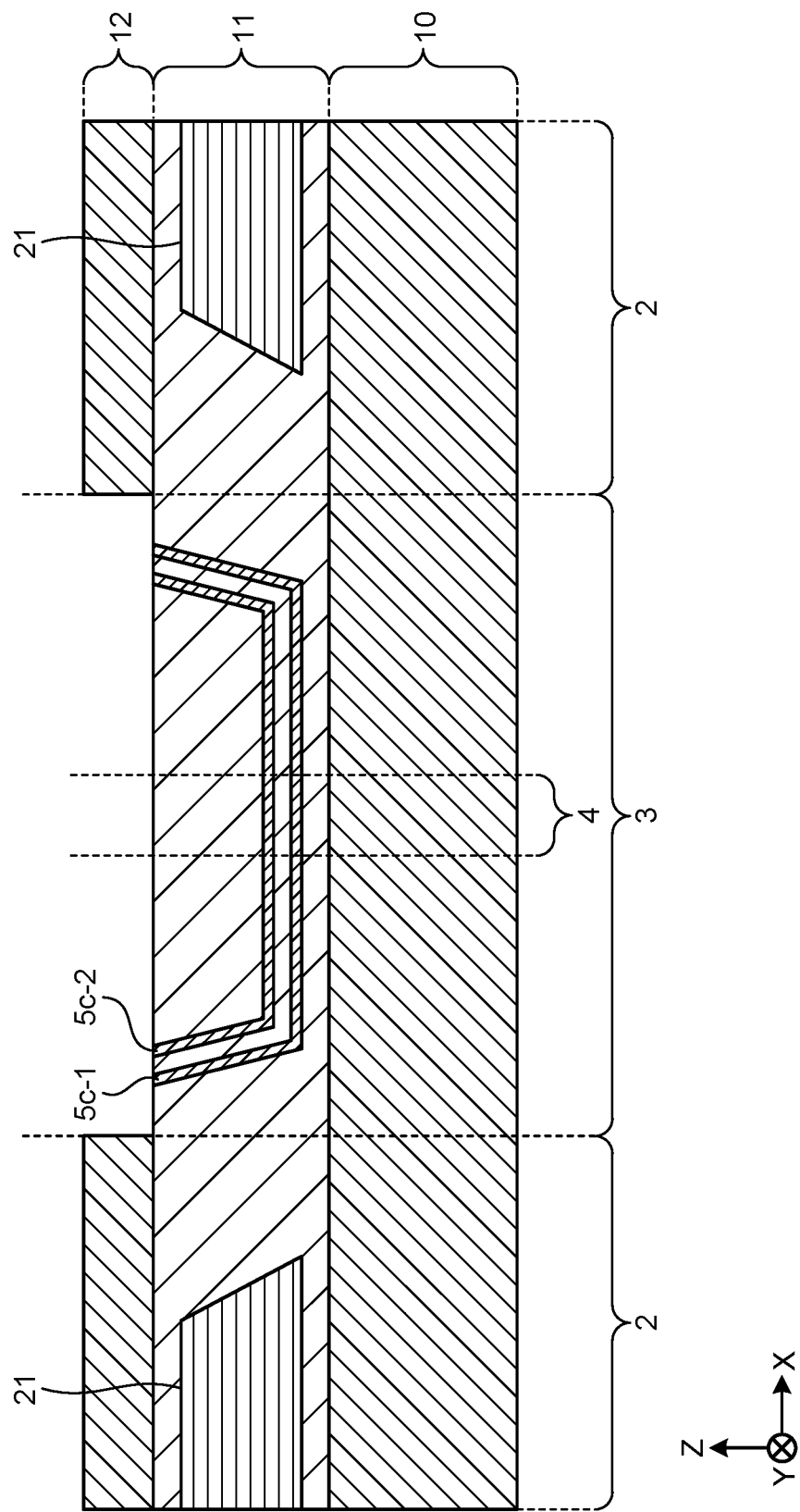
FIG. 22 is a view for explaining another example of the guide structure according to the fifth embodiment.

As illustrated in FIG. 22, the guide structure 5c may be doubly provided. That is, a guide structure 5c-1 and a guide structure 5c-2 are formed in the semiconductor wafer 1. The guide structure 5c-2 is formed on the inner wall side of the guide structure 5c-1. The semiconductor wafer 1 may be provided with triple or more guide structures 5c.

Figure 23:
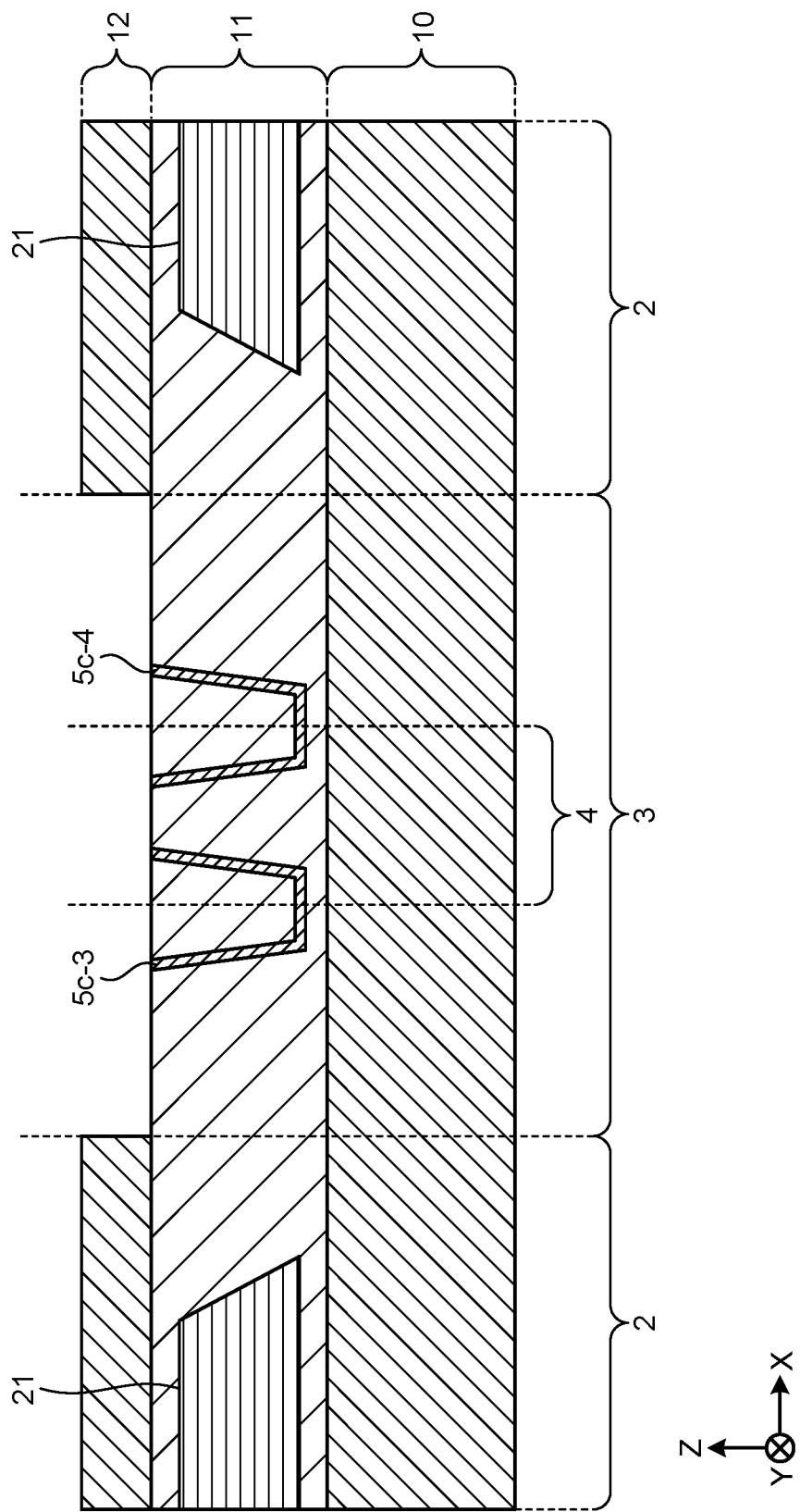
FIG. 23 is a view for explaining another example of the guide structure according to the fifth embodiment.

As illustrated in FIG. 23, both ends of the dicing line 4 cross the bottom walls of the different guide structures 5c-3 and 5c-4. Thus, if a boundary portion of the dicing line 4 is included in the bottom wall of the guide structure 5c, the crack can be prevented from entering the chip region 2.

Figure 24:
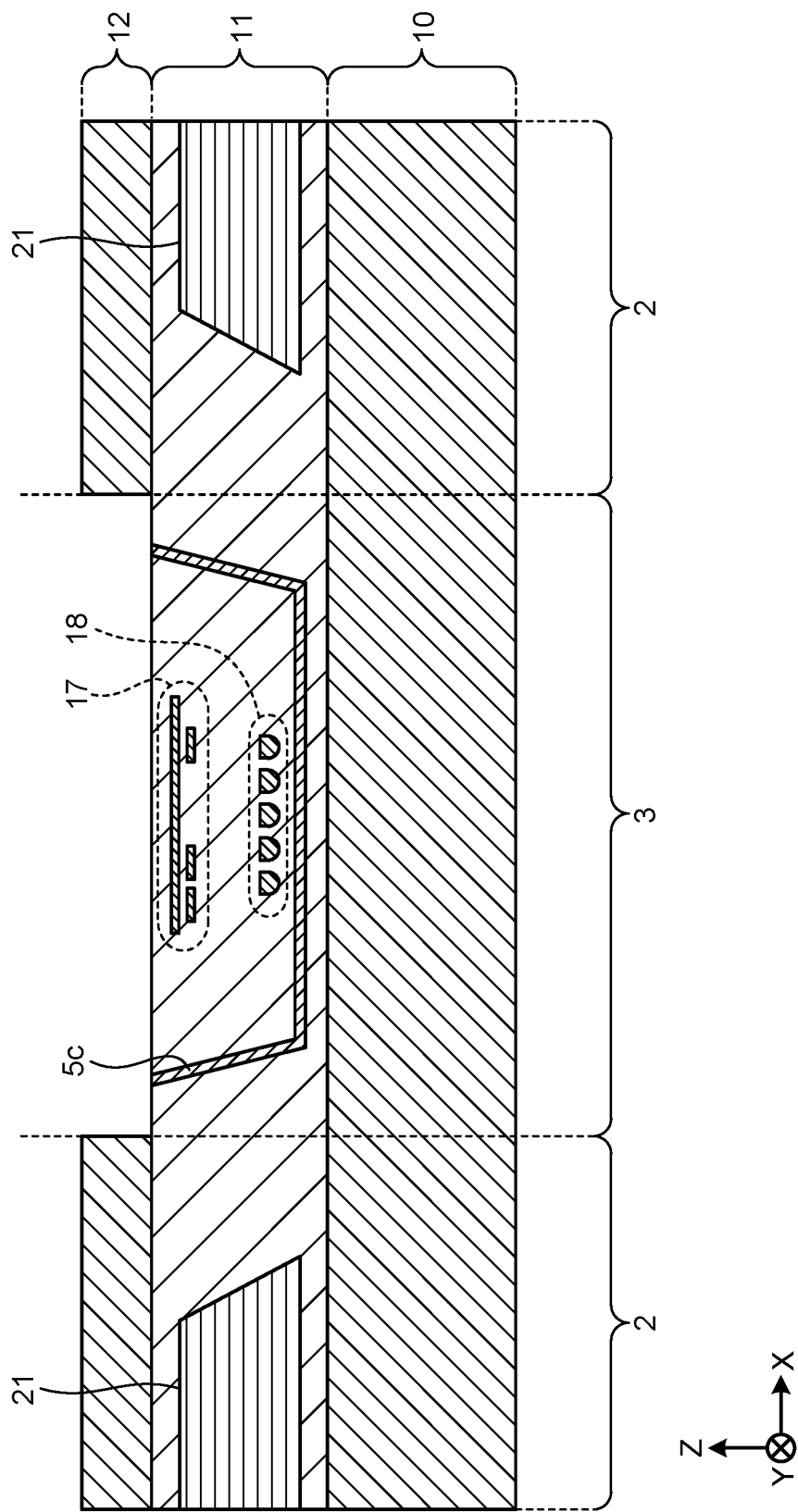
FIG. 24 is a view for explaining another example of the guide structure according to the fifth embodiment.

As illustrated in FIG. 24, it is possible to provide an arbitrary structure on the inner wall side of the guide structure 5c. In the example illustrated in FIG. 24, a test element group (TEG) pattern 17 and an alignment mark 18 are provided on the inner wall side of the guide structure 5c. If the crack occurs during dicing and the crack extends along the guide structure 5c, it is possible to prevent these structures provided on the inner wall side of the guide structure 5c from remaining in the semiconductor chip 9d.

Figure 25A:
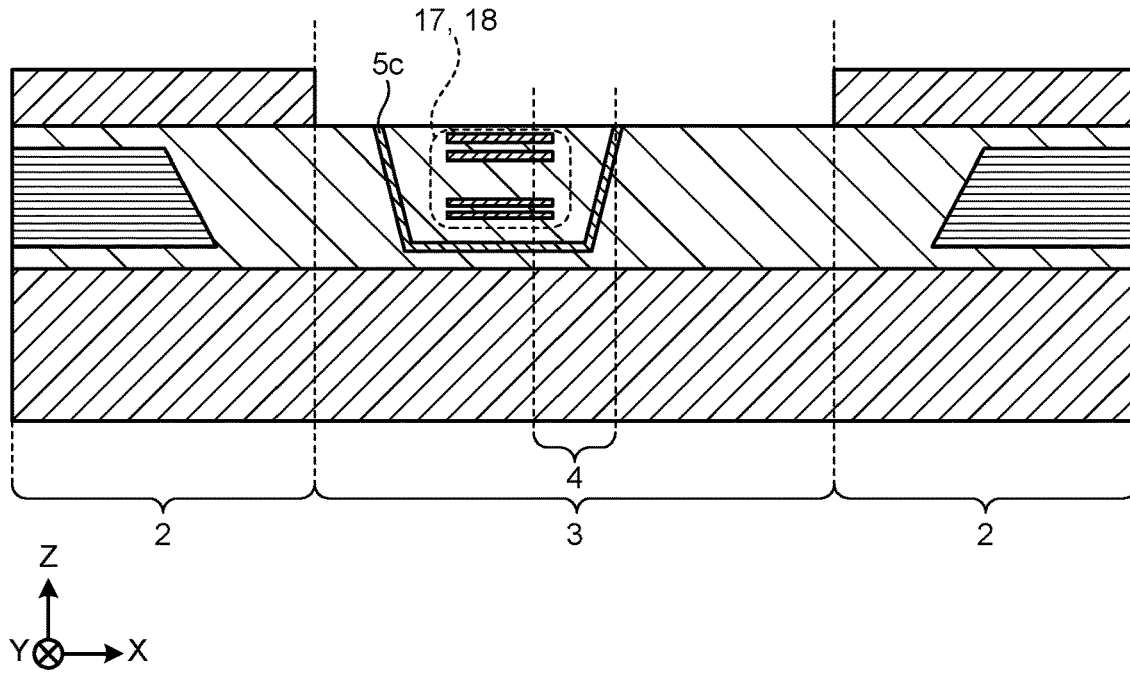
FIGS. 25A and 25B are views for explaining another example of the guide structure according to the fifth embodiment.
Figure 25B:
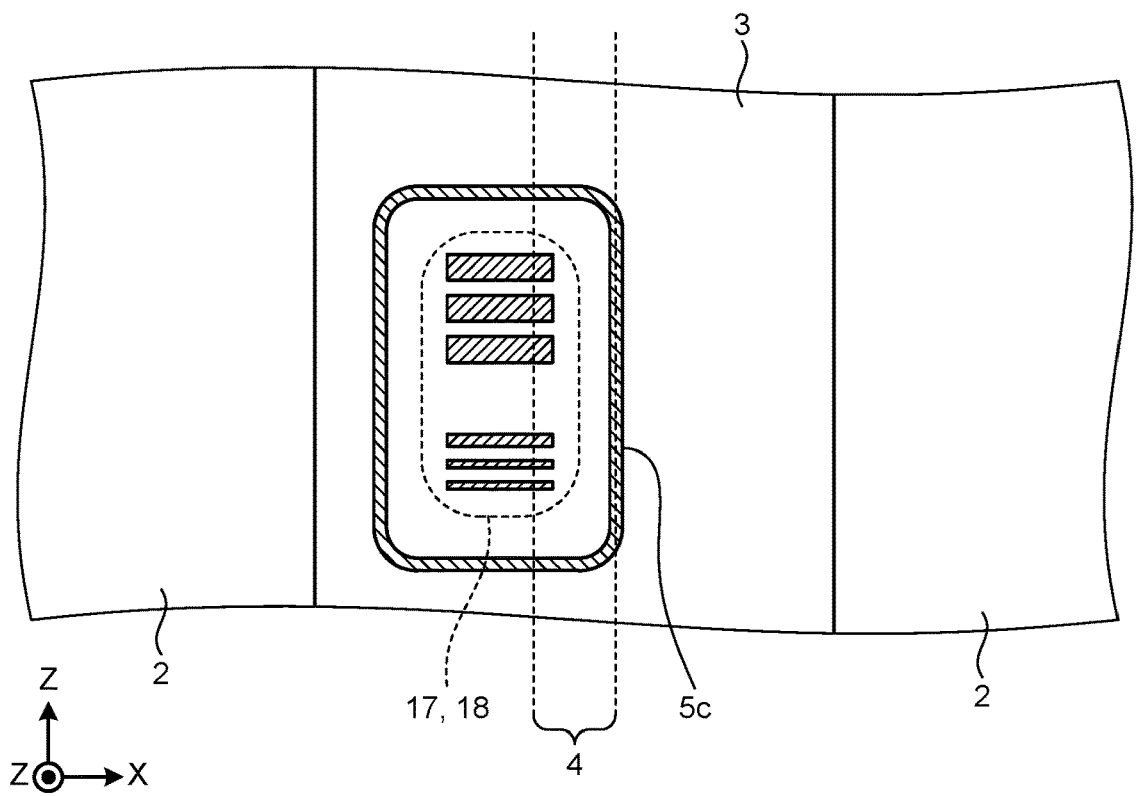

As illustrated in FIGS. 25A and 25B, the guide structure 5c may be formed at a position where a predetermined structure (for example, the TEG pattern 17 or the alignment mark 18) is provided so as to include the predetermined structure on the inner wall side. FIG. 25A is a view illustrating another example of the guide structure 5c, and FIG. 25B is a plan view of the guide structure 5c illustrated in FIG. 25A as seen from the front surface of the semiconductor wafer 1. In the example of FIGS. 25A and 25B, the guide structure 5c is formed at the position where the TEG pattern 17 and the alignment mark 18 are provided so that the TEG pattern 17 and the alignment mark 18 are located on the inner wall side of the guide structure 5c. Thus, if the crack occurs during dicing and the crack extends along the guide structure 5c, it is possible to prevent these structures provided on the inner wall side of the guide structure 5c from remaining in the semiconductor chip 9d.

In the first to fifth embodiments, the examples in which the semiconductor wafer 1 is diced by blade dicing have been described. A dicing method is not limited to this. The first to fourth embodiments can be employed even when the dicing is, for example, performed by a method such as stealth dicing, ablation, RIE, wet etching, or the like.

As described above, according to the first to fifth embodiments, the semiconductor wafer 1 is formed with the chip regions 2 that are the first regions each provided with the circuit element, and the kerf region 3 that is the second region between the chip regions 2. Then, the semiconductor wafer 1 includes the guide structure 5, 5a or 5b between the edge of the chip regions 2 and the dicing line 4 that is the third region cut when the chip regions 2 are cut into pieces in the kerf region 3. The guide structure 5, 5a or 5b is the first structure in which the embedding material is embedded in the recess extending in the Z-axis direction that is the first direction perpendicular to the surface of the silicon substrate 10.

This can prevent the crack due to the peeling of the material film from extending to the chip region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor wafer formed with a plurality of first regions each provided with a memory cell array and a peripheral circuit formed under the memory cell array to drive the memory cell array, and a second region between the first regions, the semiconductor wafer comprising:
   a material film covering the memory cell array and the peripheral circuit,
   a plurality of first structures provided in the material film and extending along in a first direction perpendicular to the semiconductor wafer, each of the plurality of first structures containing a first embedding material, the plurality of first structures being apart from each other along a second direction parallel to the semiconductor wafer, a bottom end of each of the plurality of first structures being approximately equal in height from the semiconductor wafer, and an upper end of each of the plurality of first structures being approximately equal in height from the semiconductor wafer,
   the plurality of first structures being between edges of the first regions and a third region that is cut in the second region when the first regions are separated,
   a second structure provided in the material film and extending along in the first direction, the second structure containing a second embedding material, the second structure being between the plurality of first structures and the memory cell array, and an upper end of the second structure being higher than the upper end of the plurality of the first structures,
   wherein
   a lower end of the first structure is above a transistor included in the peripheral circuit, and
   a recess is formed in the material film closer to the second region than the second structure is to the second region.

2. The semiconductor wafer according to claim 1, wherein the plurality of first structures and the second structure are formed by a common step.

3. The semiconductor wafer according to claim 2, wherein each of the first regions is provided with a wall-like structure provided along the edge in a chip region, and the second structure is the wall-like structure.

4. The semiconductor wafer according to claim 3, wherein composition of the first embedding material is equal to composition of the second embedding material.

5. The semiconductor wafer according to claim 1, wherein the plurality of first structures are wall-like structures formed to surround each of the first regions.

6. A semiconductor chip comprising:
   a semiconductor substrate including a first region provided with a memory cell array and a peripheral circuit formed under the memory cell array to drive the memory cell array and a second region formed around the first region,
   a material film covering the memory cell array and the peripheral circuit,
   a plurality of first structures provided in the material film and extending along in a first direction perpendicular to the semiconductor substrate, each of the plurality of first structures containing a first embedding material, the plurality of first structures being apart from each other along a second direction parallel to the semiconductor substrate, a bottom end of each of the plurality of first structures being approximately equal in height from the semiconductor substrate, and an upper end of each of the plurality of first structures being approximately equal in height from the semiconductor substrate, the plurality of first structures being between an edge of the first region and an end of the semiconductor substrate,
   a second structure provided in the material film and extending along in the first direction, the second structure containing a second embedding material, the second structure being between the plurality of first structures and the memory cell array, and an upper end of the second structure being higher than the upper end of the plurality of the first structures,
   wherein
   a lower end of the first structure is above a transistor included in the peripheral circuit, and
   a recess is formed in the material film closer to the second region than the second structure is to the second region.

7. The semiconductor chip according to claim 6, further comprising:
   a cut surface extending in the first direction, a release surface perpendicular to the first direction, and an exposed first film extending in the first direction, in an outer peripheral portion of the second region.

8. The semiconductor chip according to claim 7, wherein the first film has an inclined surface that inclines from the first region side to the second region side or from the second region side to the first region side as the first film goes in one direction of the first direction.

9. The semiconductor chip according to claim 8, wherein composition of the first film includes at least a part of composition of the first embedding material.

10. The semiconductor wafer according to claim 1, wherein the first embedding material and the second embedding material include a-Si or W.

11. The semiconductor chip according to claim 6, wherein the first embedding material and the second embedding material include a-Si or W.

* * * * *